(12) United States Patent
Li

(10) Patent No.: US 12,389,772 B2
(45) Date of Patent: Aug. 12, 2025

(54) DISPLAY PANEL AND ELECTRONIC DEVICE

(71) Applicant: Xiamen Tianma Display Technology Co., Ltd., Xiamen (CN)

(72) Inventor: Jieliang Li, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 500 days.

(21) Appl. No.: 17/993,671

(22) Filed: Nov. 23, 2022

(65) Prior Publication Data

US 2024/0074257 A1 Feb. 29, 2024

(30) Foreign Application Priority Data

Aug. 24, 2022 (CN) .......................... 202211019028.0

(51) Int. Cl.
| | |
|---|---|
| *H10K 59/131* | (2023.01) |
| *H10D 86/40* | (2025.01) |
| *H10D 86/60* | (2025.01) |
| *H10K 59/121* | (2023.01) |
| *H10K 59/35* | (2023.01) |

(52) U.S. Cl.
CPC .......... *H10K 59/131* (2023.02); *H10D 86/441* (2025.01); *H10D 86/60* (2025.01); *H10K 59/1213* (2023.02); *H10K 59/353* (2023.02)

(58) Field of Classification Search
CPC .. H10K 59/131; H10K 59/353; H10K 59/352; H10K 59/1213; H10D 86/441; H10D 86/60
See application file for complete search history.

(56) References Cited

U.S. PATENT DOCUMENTS

2024/0213269 A1* 6/2024 Zhao .................... G02F 1/1362

\* cited by examiner

*Primary Examiner* — James R Greece
*Assistant Examiner* — Jose M Diaz
(74) *Attorney, Agent, or Firm* — Anova Law Group, PLLC

(57) ABSTRACT

A display panel and an electronic device are provided. The display panel includes an array substrate including a substrate, a pixel circuit disposed on the substrate, and a plurality of signal lines distributed in parallel and disposed on a side of the pixel circuit away from the substrate. The plurality of signal lines are connected to wirings below the signal lines through first conductive holes. The display panel also includes a display array including a plurality of sub-pixels and located on a side of the plurality of signal lines away from the substrate. In a direction perpendicular to the substrate, the signal lines include overlap portions overlapping first electrodes of the plurality of sub-pixels; at least two overlap portions correspond to sub-pixels of a same emission color and include first conductive holes; and orthographic projections of the at least two overlap portions on the substrate are same.

20 Claims, 15 Drawing Sheets

211a   211b 211a   211b

DISPLAY PANEL AND ELECTRONIC DEVICE

CROSS-REFERENCE TO RELATED APPLICATION

This application claims the priority of Chinese Patent Application No. 202211019028.0, filed on Aug. 24, 2022, the content of which is incorporated by reference in its entirety.

TECHNICAL FIELD

The present disclosure generally relates to the field of display technologies and, more particularly, relates to a display panel and an electronic device.

BACKGROUND

With the continuous development of science and technology, more and more electronic devices with display function are widely used in people's daily life and work, which has brought great convenience to people's daily life and work and has become an indispensable and important tool of people's life. The main component of an electronic device to realize the display function is the display panel. Organic light-emitting diode (OLED) display panels have many advantages, such as self-luminescence, no backlight, high contrast ratio, small thickness, wide viewing angle, fast response speed, flexible panels, wide operating temperature range, and simple structure and process, and have become one of the current mainstream display panels.

An OLED display panel includes an array substrate and a display array on the array substrate, and the display array includes a plurality of sub-pixels. The array substrate includes a substrate and pixel circuits on the substrate. The pixel circuit is connected with a sub-pixel, and is used for controlling the sub-pixel to perform the image display.

In the OLED display panel, when the sub-pixels of the same emission color display the same brightness under the same viewing angle, there is a problem of display color shift, which affects the image display quality. The present disclosed display panels and electronic devices are direct to solve one or more problems set forth above and other problems in the arts.

SUMMARY

One aspect of the present disclosure provides a display panel. The display panel includes an array substrate including a substrate, a pixel circuit disposed on the substrate, and a plurality of signal lines distributed in parallel and disposed on a side of the pixel circuit away from the substrate. The plurality of signal lines are connected to wirings below the plurality of signal lines through first conductive holes. The display panel also includes a display array including a plurality of sub-pixels and located on a side of the plurality of signal lines away from the substrate. In a direction perpendicular to the substrate, the plurality of signal lines include overlap portions overlapping first electrodes of the plurality of sub-pixels; at least two overlap portions correspond to sub-pixels of a same emission color and include first conductive holes; and orthographic projections of the at least two overlap portions on the substrate are same.

Another aspect of the present disclosure provides an electronic device. The electronic device includes a display panel. The display panel includes an array substrate including a substrate, a pixel circuit disposed on the substrate, and a plurality of signal lines distributed in parallel and disposed on a side of the pixel circuit away from the substrate. The plurality of signal lines are connected to wirings below the plurality of signal lines through first conductive holes. The display panel also includes a display array including a plurality of sub-pixels and located on a side of the plurality of signal lines away from the substrate. In a direction perpendicular to the substrate, the plurality of signal lines include overlap portions overlapping first electrodes of the plurality of sub-pixels; at least two overlap portions correspond to sub-pixels of a same emission color and include first conductive holes; and orthographic projections of the at least two overlap portions on the substrate are same.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings can also be obtained from these drawings without creative effort.

DETAILED DESCRIPTION

The embodiments of the present disclosure will be described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those of ordinary skill in the art without creative efforts shall fall within the protection scope of the present application.

To make the above objects, features and advantages of the present disclosure more clearly understood, the present disclosure will be described in further detail below with reference to the accompanying drawings and specific embodiments.

Figure 1:
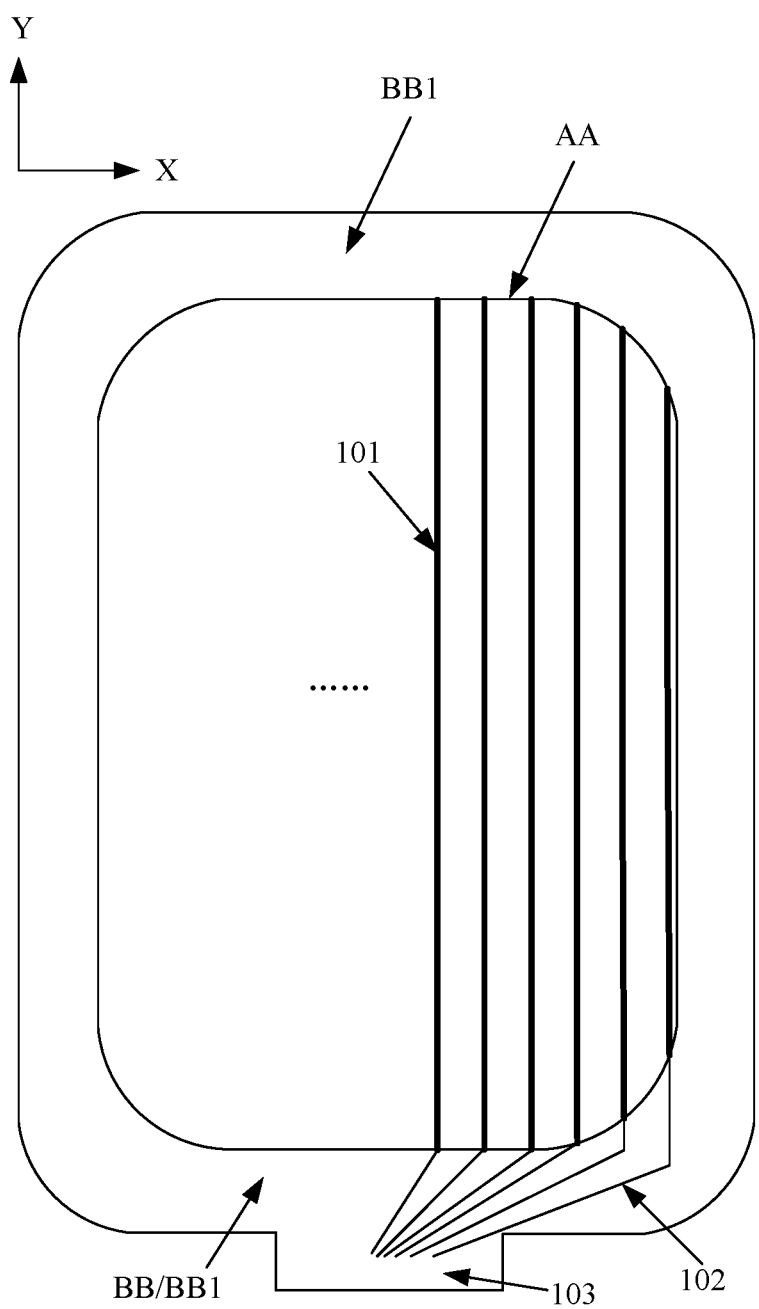
FIG. 1 illustrates a display panel.

FIG. 1 is a schematic structural diagram of a display panel. As shown in FIG. 1, the display panel includes a display area AA and a non-display area BB surrounding the display area AA. The display area AA is provided with pixel structures and data lines 101. The pixel structure includes sub-pixels and pixel circuits connected to the sub-pixels. To clearly illustrate the wiring method in the display panel, the pixel structure is not shown in FIG. 1. The data line 101 is used to provide a data signal for the pixel circuit to control the sub-pixels to perform light-emitting display.

In the first direction, two sides of the display area AA respectively have a first non-display area BB1. The first direction Y is parallel to the length direction of the data line 101. The first non-display area BB1 includes a bonding area 103 for bonding the display driver chip and setting the fan-out line 102. In the manner shown in FIG. 1, the first non-display area BB1 at the lower end is set for setting the bonding area 103 and the fan-out line 102.

Generally, a scanning circuit for providing scanning signals for the pixel circuits is also provided in the non-display area BB. The scanning circuit is located in the non-display area BB adjacent to the display area AA in the second direction X. The scanning circuit is not shown in FIG. 1. Both the scanning circuit and the end of the data line 101 facing the same first non-display area BB1 need to be connected to the fan-out line 102 to be connected to the bonding area 103 in the first non-display area BB1 through the fan-out line 102.

As shown in FIG. 1, for the first non-display area BB1 where the binding area 103 needs to be set, in the top corner area near the display area AA (the lower right corner area in FIG. 1), it is necessary to set the scanning circuit and the data line 101 at the same time. The fan-out line 102 causes the frame width of the top corner region to be larger. Moreover, most of the four top corners of the display area AA in the current display panel are set with R-angles, that is, the top corner area is an outwardly convex arc. To improve the display quality, at the arc-shaped R-angle position, the sub-pixels need to be adapted to the arc-shaped R-angle and arranged in a stepped shape. The wiring from this sub-pixel to the non-display area BB needs to be set near the R-angle. In the non-display area, that is to say, in the first non-display area BB1 near the R corner area, the number of wirings is large, resulting in a larger width of the frame of this area.

It should be noted that, in the embodiment of the present disclosure, the vertex angle of the display area AA is not limited to the design of the R angle, and the display area AA may also be a rectangular display area with right-angled vertex angles.

To reduce the frame width of the display panel in the corner area, the data lines 101 close to the edge of the display panel can be drawn out from the middle area of the display area AA through the fan-out line 102, thereby reducing the number of wirings in the corner area of the display panel, thereby reducing the number of wirings in the display panel and the frame width of the top corner. When the data line 101 adjacent to the edge of the display panel is drawn out from the middle area of the display area AA through the fan-out line 102, the implementation can be as shown in FIG. 2 and FIG. 3.

Figure 2:
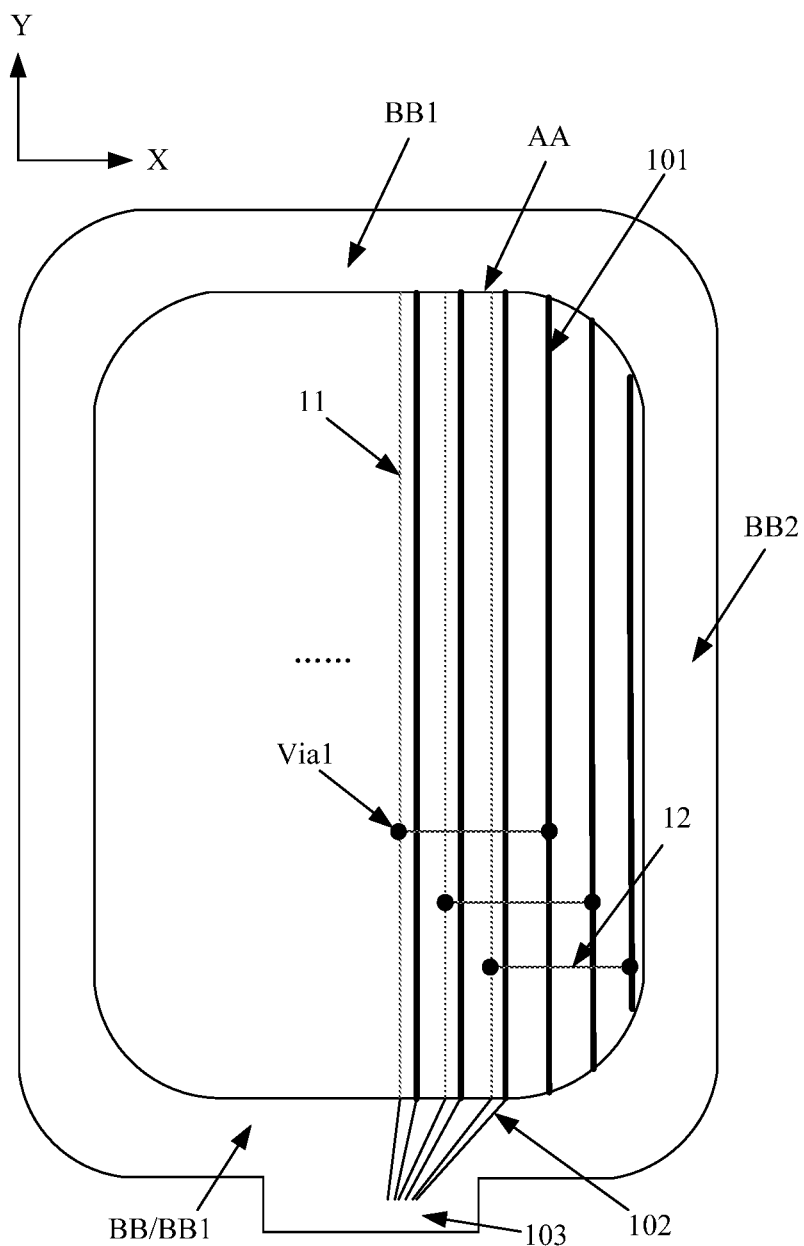
FIG. 2 illustrates another display panel.
Figure 3:
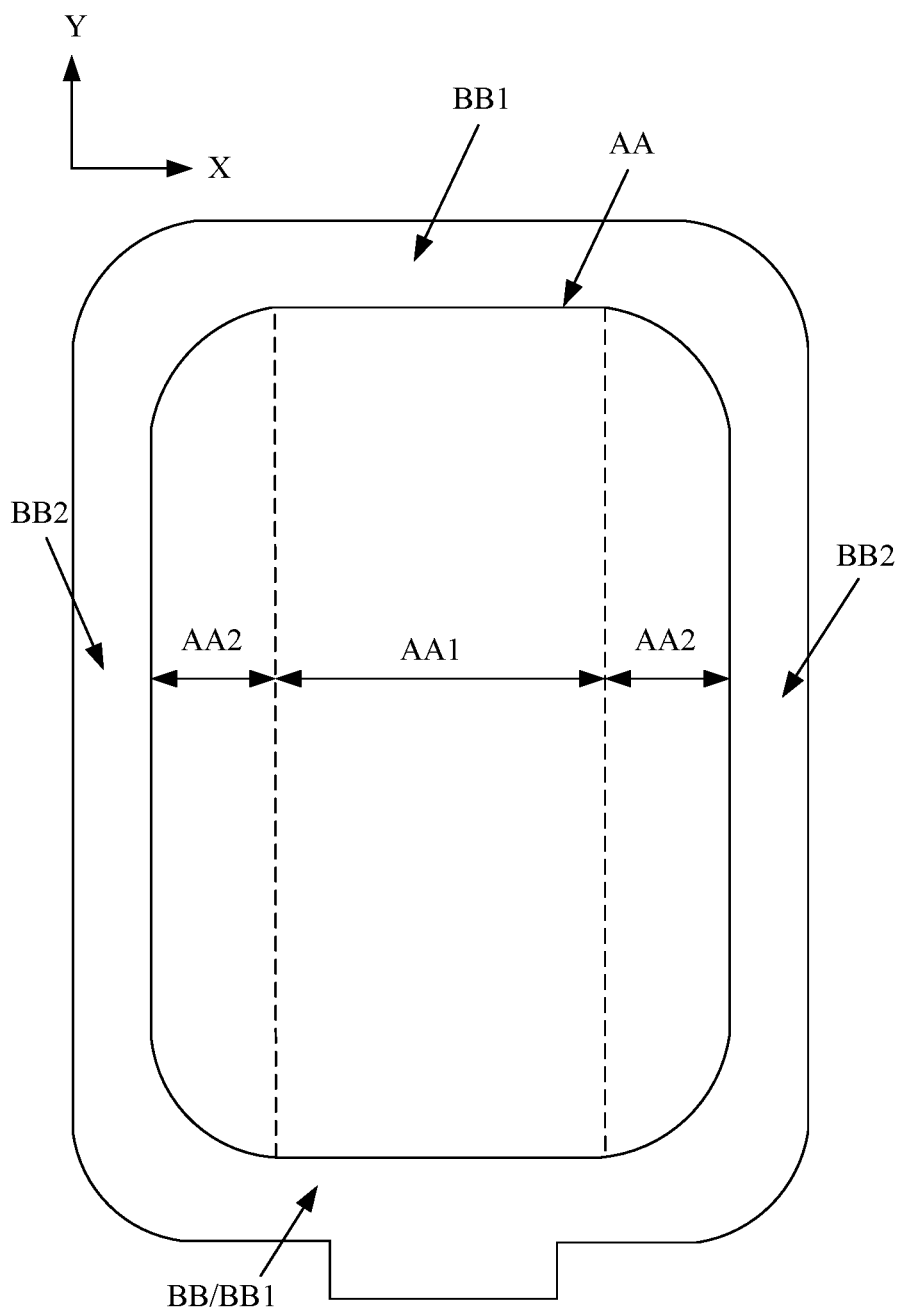
FIG. 3 illustrates a region breakdown of the display panel in FIG. 2.

FIG. 2 is a schematic structural diagram of another display panel, and FIG. 3 is a schematic diagram of a region breakdown of a display area in the display panel shown in FIG. 2. As shown in FIGS. 2-3, in this manner, the non-display area BB includes a second non-display area BB2 adjacent to the display area AA in the second direction X. The second direction X is perpendicular to the first direction Y; and the first direction Y and the second direction are all parallel to the display surface of the display panel.

In the second direction X, two sides of the display area AA respectively have a second non-display area BB2. In the second direction X, the display area AA includes a first sub-display area AA1 and two second sub-display areas AA2, and the two second sub-display areas AA2 are located on both sides of the first sub-display area AA1. For example, there is a second sub-display area AA2 between the second non-display area BB2 and the first sub-display area AA1.

It should be noted that the dotted line in FIG. 2 is only used to schematically display the regional distribution of the display area AA in the second direction X to facilitate the clear description of the wirings in the technical solution of the embodiment of the present disclosure, and there is no visually visible border structure in the actual display panel.

Both the first sub-display area AA1 and the second sub-display area AA2 include a plurality of data lines 101. The first sub-display area AA1 may be provided with a plurality of first connection lines 11 parallel to the first direction Y. The data lines 101 in the second sub-display area AA2 are connected to the first connection lines 11 through the second connection lines 12, and are connected to the fan-out lines 102 through the first connection lines 11. The second connection line 12 is parallel to the second direction X. The wiring direction of the second connection line 12 may be set based on requirements. In other embodiments, the second connection line 12 may also be set to have an angle greater than 0° and less than 90° along the second direction X.

To facilitate the second connection line 12 to connect the corresponding data line 101 and the first connection line 11, the first connection line 11 can be disposed in the same layer as the data line 101, and the second connection line 12, the first connection line 11 and the data line 101 may be disposed in different layers. In this way, for a set of first connection lines 11 and data lines 101 that need to be connected through the second connection lines 12, the first connection lines 11 and the data lines 101 can be connected to the second connection lines 12 through the first conductive holes Via1, respectively. In addition, the second connection line 12 can be insulated and crossed with other first connection lines 11 and data lines 101 between the group of first connection lines 11 and the data lines 101 to facilitate the layout of the data lines 101, the first connection lines 11 and the second connection lines 12.

Compared with the structure shown in FIG. 1, the structures shown in FIGS. 2-3 can lead out the data line 101 located in the second sub-display area AA2 through the first connection line 11 located in the first sub-display area AA1 and connect it to the fan-out line 102, and there is no need to set the fan-out lines of the data lines 101 in the vertex area of the display panel, and the number of wirings in the vertex area is reduced, thereby reducing the frame width of the display panel in the vertex area.

In the direction perpendicular to the display panel, the overlap portion of the data line 101 and the first electrode of the sub-pixel will cause the first electrode of the sub-pixel to be uneven. If the first conductive holes Via1 connected to the data line 101 are arranged randomly, some first conductive holes Via1 of the data lines 101 may be located in the overlap portion, and the first conductive holes Via1 of some data lines 101 may be located outside the overlap portion. Accordingly, the surface structures of the overlap portions corresponding to the sub-pixels of the same light-emitting color are not same, which leads to different flatness of the first electrodes of the sub-pixels of the same light-emitting color. Thus, when the sub-pixels of the same light-emitting color display the same brightness under the same viewing angle, there is a display color shift problem, which affects the image display quality.

In addition, compared with the structure shown in FIG. 1, the method shown in FIG. 2 has a greater impact on the flatness of the first electrode due to the addition of the first connection line 11, the second connection line 12 and the first conductive hole Via1 connected thereto. This will further aggravate the display color shift problem of sub-pixels of the same emission color in the display panel.

In the manner shown in FIG. 2 and FIG. 3, the reasons for the deterioration of the flatness of the first electrode 211 are as follows.

To facilitate the arrangement of the first connection line 11, the second connection line 12 and the first conductive hole Via1, a first metal layer and a second metal layer need to be arranged between the pixel circuit and the sub-pixels. The first metal layer is located between the sub-pixels and the second metal layer, and the second metal layer is located between the pixel circuit and the first metal layer. The first metal layer is at least configured for forming the data lines and the first connection lines, and the second metal layer is at least configured for forming the second connecting lines.

To make the sub-pixels have a relatively flat disposition surface, a first organic layer needs to be disposed between the first metal layer and the sub-pixels. To make the first metal layer have a relatively flat disposition surface, a second organic layer needs to be disposed between the first metal layer and the second metal layer.

The data line 101 and the first connection line 11 need to be connected through the first conductive hole Via1 and the corresponding wiring below, respectively. If the aperture of the first conductive hole Via1 is small, the first conductive hole Via1 can be arranged in the gap between adjacent sub-pixels in the first direction Y to avoid the first conductive hole Via1 on the data line 101 and the first connection line 11 for affecting the flatness of the first electrode. However, because the first conductive hole Via1 connected to the data line 101 and the first connection line 11 is formed in the first organic layer, the thickness of the first organic layer is larger than that of the inorganic film layer in the display panel, for example, the thickness of the first organic layer may be 4 to 10 times of the thickness of the inorganic film layer in the display panel. Therefore, the aperture of the first conductive holes Via1 formed in the organic layer is relatively large. Accordingly, it may be impossible to allow all the openings of the first conductive holes Via1 and the sub-pixel 21 not to overlap, and at a least a portion of the first conductive holes Via1 have to be disposed below the sub-pixels, thereby affecting the flatness of the first electrodes.

The first organic layer needs to be formed by a coating process. On the one hand, based on the limitations of the coating process equipment, the thickness of the first organic layer cannot be made large enough to completely flatten the surface of the sub-pixels. When the thickness of the organic layer is too large, a large amount of exposure is required to form a conductive hole connecting the first electrode and the underlying metal layer in the first organic layer, which increases the process difficulty and the manufacturing cost. Based on this, it is impossible to eliminate the influence of the data line 101 and the first connection line 11 and the first conductive hole Via1 connected thereto on the flatness of the upper first electrode by forming the first organic layer with a sufficient thickness.

Figure 4:
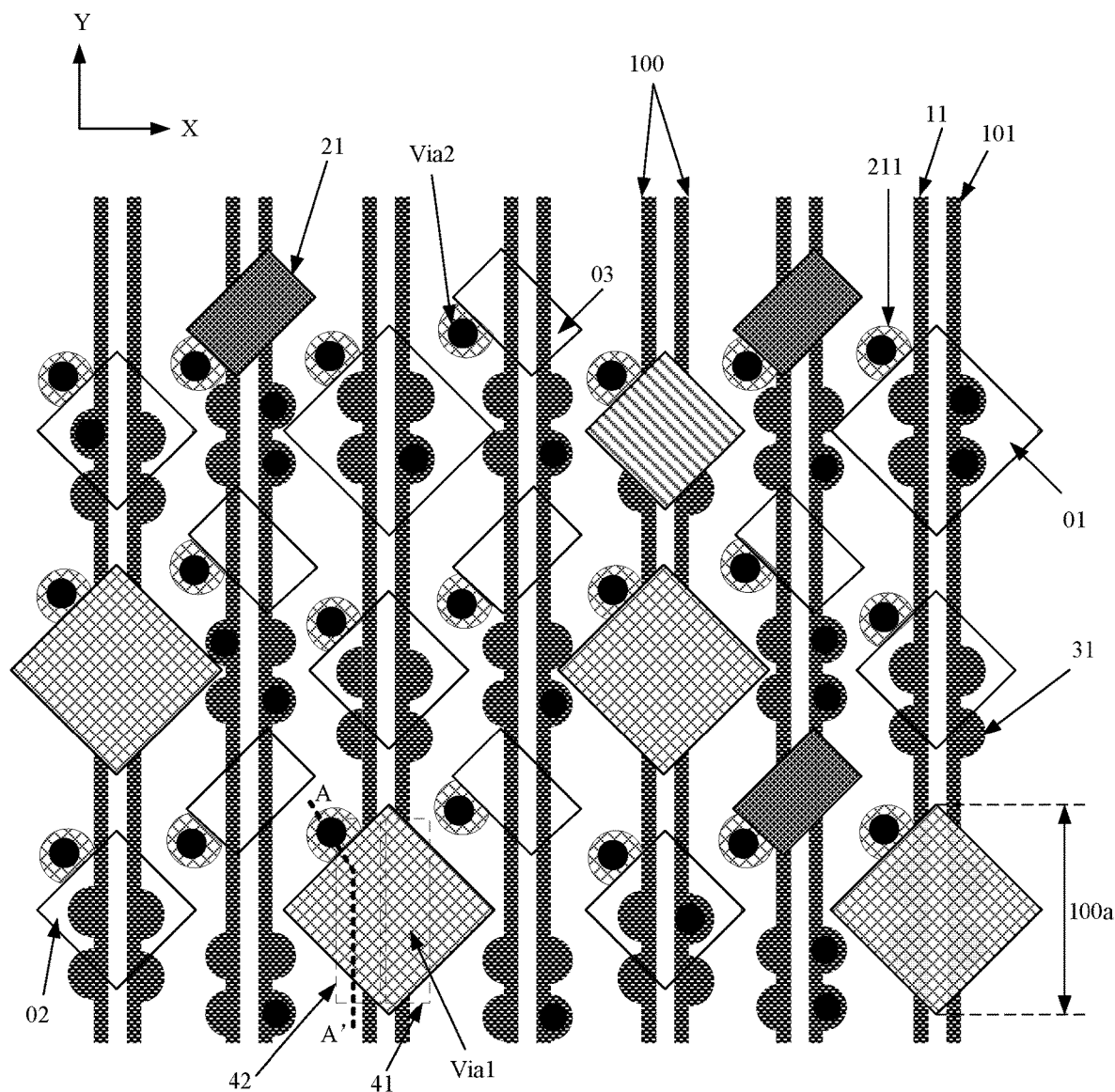
FIG. 4 illustrates a layout of signal lines and sub-pixels of an exemplary display panel according to various disclosed embodiments of the present disclosure.
Figure 5:
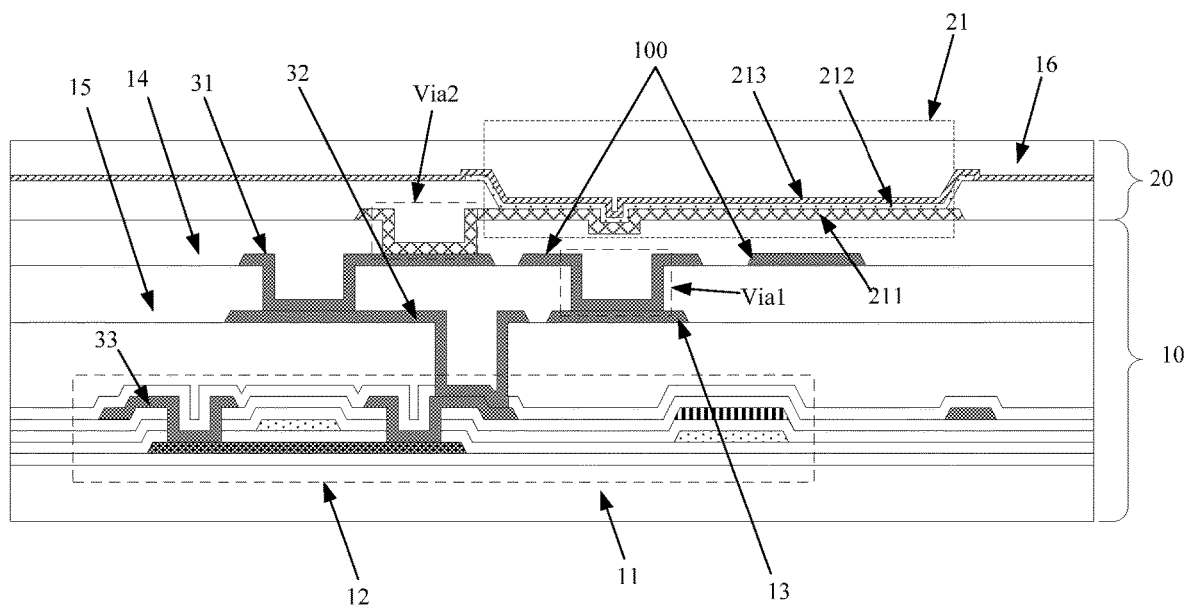
FIG. 5 illustrates an exemplary A-A-sectional view of the display panel in FIG. 4.

The present disclosure provides a display panel, which may solve the display color shift problem of sub-pixels of the same light-emitting color. FIGS. 4-5 illustrates an exemplary display panel according to various disclosed embodiments of the present disclosure. FIG. 4 is a schematic diagram of the layout of signal lines and sub-pixels in the exemplary display panel provided by an embodiment of the present disclosure, and FIG. 5 is an A-A-sectional view of the display panel in FIG. 4

As shown in FIGS. 4-5, the display panel may include an array substrate 10. The array substrate 10 may include a substrate 11, a pixel circuit 12 disposed on the substrate 11; and a plurality of signal lines 100 distributed in parallel. The signal lines 100 may be disposed on the side of the pixel circuit 12 away from the substrate 11. The signal lines 100 may be connected to the wiring 13 below the signal lines 100 through the first conductive holes Via1. For example, the signal line 100 may need to be connected to the wiring 13 facing the substrate 11 through the first conductive hole Via1.

The display panel may also include a display array 20. The display array 20 may be located at the side of the signal line 100 away from the substrate 11. The display array 20 may include a plurality of sub-pixels 21.

In the direction perpendicular to the substrate 11, the signal line 100 may have an overlap portion 100a overlapping with the first electrode 211 of the sub-pixel 21.

At least two overlap portions 100a may correspond to the sub-pixels 21 of a same emission color and may include the first conductive holes Via1. The orthographic projections of the at least two overlap portions 100a on the substrate 11 may be same.

As described in the following embodiments, the wiring 13 may include a second connection line 12 for connecting the data line 101 and the first connection line 11. Or, the wiring 13 may be configured to connect the data line 101 with the pixel circuit 12.

In one embodiment of the present disclosure, the signal line 100 may include an overlap portion 100a that overlaps with the sub-pixel 21. At least two overlap portions 100a may correspond to the sub-pixels 21 of the same emission color and may include a first conductive hole Via1. The orthographic projections of the two overlap portions 100a on the substrate 11 may be same such that the first electrodes 211 of the sub-pixels 21 corresponding to the at least two overlap portions 100a may have a same or similar flatness. When the sub-pixels display the same brightness under the same viewing angle, the display effect may be same, the display color shift problem of multiple sub-pixels 21 of the same light-emitting color may be solved, and the image display quality may be improved.

In one embodiment, the display panel may be an OLED panel, and the sub-pixels 21 may be OLED light-emitting elements. The sub-pixel 21 may include a first electrode 211 on the side of the signal line 100 away from the substrate 11, an organic light-emitting layer 212 on the side of the first electrode away from the substrate 11; a second electrode 213 on the side of the organic light-emitting layer 212 away from the first electrode 211. The first electrode 211 may be the anode of the OLED light-emitting element, and the second electrode 213 may be the cathode of the OLED light-emitting element. The display array 20 may include a pixel definition layer 16. The pixel definition layer 16 may include a plurality of pixel apertures corresponding to the sub-pixels 21 one-to-one and sub-pixels 21 formed based on the pixel openings. The pixel apertures may expose a portion of the first electrode 211 of the sub-pixel 21, and the organic light-emitting layer 212 may be located on the surface of the first electrode 211 exposed by the pixel aperture. Each sub-pixel 21 may have a common second electrode 213. In the direction perpendicular to the substrate 11, the overlap portion 100a may be located in the corresponding pixel aperture.

The side of the first electrode 211 facing the pixel circuit 12 may include a second conductive hole Via2, and the second conductive hole Via2 may be configured to connect the first electrode 211 with the transistor in the pixel circuit 12. In one embodiment of the present disclosure, in the direction perpendicular to the substrate 11, the pixel aperture corresponding to the second conductive holes Via2 connected to the first electrodes 211 may not overlap.

In the direction parallel to the substrate 11, the signal line 100 may include a protruding structure 31. The first conductive hole Via1 may be located at the side of the protruding structure 21 facing the substrate 11. By arranging the protruding structure 31, the signal line 100 with a smaller width (for example, the width of the signal line 100 where a protruding structure is not provided) may be used, and at the same time, it may be convenient to provide a location where the first conductive hole Via1 is arranged. For example, the first conductive hole Via1 may be disposed at the protruding structure 31, and the contact resistance between the first conductive hole Via1 and the wiring 13 underneath may be reduced. In addition, the overlap portion 100a may be provided with a plurality of protruding structures 31, some protruding structures 31 may be configured for arranging the first conductive holes Via1, and other of the protruding structures 31 may be configured to make different overlap portions 100a have the same orthographic projection on the substrate 11.

Figure 6:
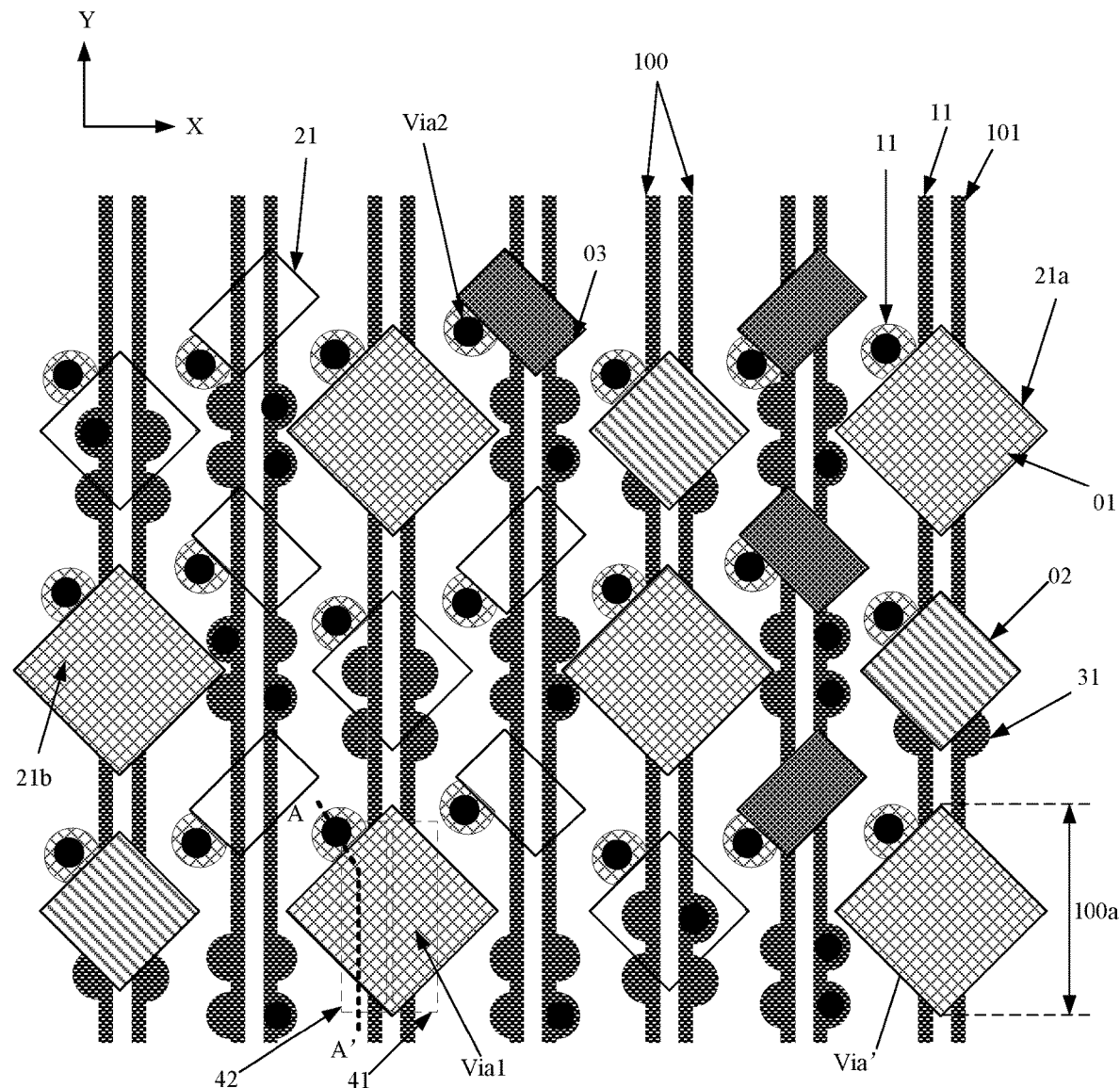
FIG. 6 illustrates a layout of signal lines and sub-pixels of another exemplary display panel according to various disclosed embodiments of the present disclosure.
Figure 7:
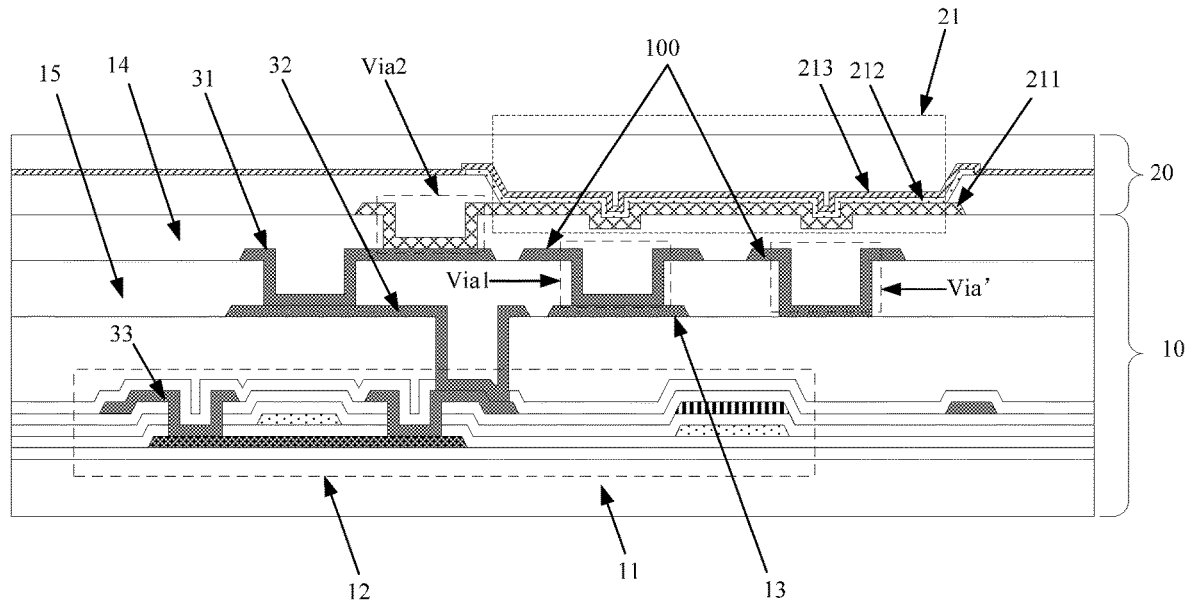
FIG. 7 illustrates an A-A sectional view of the display panel in FIG. 6.

To further improve the brightness consistency of the sub-pixels 21 of the same emission color under the same gray scale, the display panel may also be set as shown in FIG. 6 and FIG. 7.

FIG. 6 is a schematic diagram of the layout of signal lines and sub-pixels in another exemplary display panel provided by an embodiment of the present disclosure, and FIG. 7 is an A-A-sectional view of the display panel shown in FIG. 6. On the basis of the structures shown in FIGS. 4-5, the side of the overlap portion 100a facing the substrate 11 as shown in FIGS. 6-7 may also include an auxiliary hole Via'. The auxiliary hole Via' may be electrically disconnected from the metal layer under the signal line 100.

In the structure shown in FIGS. 6-7, for the overlap portion 100a including the first conductive hole Via1 and the corresponding sub-pixels 21 of the same emission color, not only the uniformity of the flatness of the first electrodes 211 of the sub-pixels 21 of a same emitting color may be improved by arranging the orthographic projections of the overlapping portions 100a on the substrate 11 to be same, but also the uniformity of the flatness of the first electrodes 211 of the sub-pixels of the same emitting color 21 may be improved by disposing the auxiliary holes Via'. Therefore, on the basis of the structure shown in FIG. 4 and FIG. 5, the uniformity of the flatness of the first electrodes 211 of the sub-pixels 21 of the same emission color may be further improved, the color shift problem of the sub-pixels 21 of the same emission color may be solved, and the display quality may be improved.

As shown in FIG. 6 and FIG. 7, in the direction parallel to the substrate 11, one side of the overlap portion 100a may include a protruding structure 31, and the auxiliary hole Via' and the first conductive hole Via1 may be respectively located at the side of the corresponding protruding structure 31 facing the substrate 11. By arranging the protruding structure 31, the auxiliary hole Via' and the first conductive hole Via1 may be conveniently arranged while the signal line 100 with a smaller width is used, and the contact resistance between the first conductive hole Via1 and the wiring 13 beneath may be reduced. Further, the overlap portion 100a may include a plurality of protruding structures 31, some of the protruding structures 31 may be configured for arranging the auxiliary holes Via and the first conductive holes Via1, and some of the protruding structures 31 may be configured to make different overlap portions 100a have a same orthographic projection on the substrate 11.

In one embodiment of the present disclosure, to further ensure the consistency of the hole structure in the overlap portion 100a such that the flatness of the corresponding first electrodes 211 may be consistent, for overlap portions 100a corresponding to the sub-pixels 21 of the same emission color are arranged in, different overlap portions 100a of at least two overlap portions 100a may be set with a same number of through holes, and the through holes may include the auxiliary holes Via' and the first conductive hole Via1. For example, for the sub-pixel 21a and the sub-pixel 21b of the same emission color in FIG. 6, both may correspond to four through holes. On the overlap portion 100a corresponding to the sub-pixel 21a, the corresponding signal line 100 on the left may include two auxiliary hole Via', and the corresponding signal line 100 on the right side may include two first conductive holes Via1. On the overlap portion 100a corresponding to the sub-pixel 21b, the corresponding signal line 100 on the left side may include two auxiliary holes Via', and the corresponding signal line 100 on the right side may include an auxiliary hole Via' and a first conductive hole Via1. In such a configuration, for the overlap portions 100a corresponding to the sub-pixels 21 of the same emission color, because the overlap portions 100a may have the same number of through holes, the flatness of the different overlap portions 100a may be affected to the same or similar extent by the through holes, the uniformity of the flatness of the corresponding first electrodes 211 may be improved.

In one embodiment, for the overlap portion 100a corresponding to the sub-pixels 21 of the same emission color, to make the through holes in the overlap portion 100a have a relatively consistent degree of influence on the flatness of the first electrodes 211, each overlap portion 100a of the overlapping portions 100a corresponding to the sub-pixels of at least one emission color may be set to include a same number of through holes. For example, for all the sub-pixels 21 of the same emission color as the sub-pixels 21a and the sub-pixels 21b in FIG. 6, the corresponding overlap portions 100 a may all be provided with four through holes. In such a configuration, the first electrodes 211 of the sub-pixel 21 of the at least one light-emitting color may have an uniform flatness. Accordingly, the display color shift problem of the sub-pixels 21 of the at least one light-emitting color may be avoided. Obviously, in other manners, in the overlap portions 100a corresponding to the sub-pixels 21 of the same emission color, the number of through holes corresponding to at least two overlap portions 100a may be the same and the first electrodes corresponding to the at least two overlap portions 100a may have a relatively consistent flatness.

In the display panel provided by the embodiment of the present disclosure, in at least two overlap portions 100a corresponding to the sub-pixels 21 of the same emission color, in the direction perpendicular to the substrate 11, the positions of the plurality of through holes of the different overlap portions 100a relative to the corresponding first electrodes 211 may be same. As shown in FIG. 6, the sub-pixel 21a and the sub-pixel 21b of the same emission color may include the same quadrilateral structure, and the layout positions of the four through holes corresponding to the two sub-pixels may be same with respect to the quadrilateral. In such a configuration, the first electrodes 211 corresponding to the at least two overlap portions 100a may have a relatively consistent flatness.

In one embodiment, to improve the flatness of the first electrode 211 to a greater extent, as shown in FIG. 6, in the overlap portions 100 corresponding to the sub-pixels 21 with a same emission color as the sub-pixel 21a and the sub-pixel 21b, in the direction perpendicular to the substrate 11, the positions of the plurality of through holes of the overlap portions 100a may all be set same relative to the corresponding first electrodes 211.

In the display panel provided by one embodiment of the present application, the fan-out lines 102 may be connected in the manner shown in FIG. 1. The display array 20 may be arranged to include multiple columns of sub-pixels 21. The first direction Y may be the column direction of the display array 20. The signal line 100 may include a data line 101. The pixel circuit 12 connected to a column of sub-pixels 21 may be connected to a corresponding data line 101, and the data line 101 may be located below the column of sub-pixels 21 such that the data line 101 may include an overlap portion 100a opposite to the first electrode 211. In such a manner, when the fan-out lines 102 are connected in the manner shown in FIG. 1, the influence of the overlap portions 100 of the data lines 101 on the flatness of the first electrodes 211 of the sub-pixels 21 may be reduced such that the sub-pixels 21 of the same emission color may include the first electrode 211 having a same or a similar degree of flatness. Accordingly, the display color shift problem of the sub-pixels 21 of the same emission color may be solved.

When the fan-out lines 102 are connected in the manner shown in FIG. 1, each sub-pixel 21 may correspond to one overlap portion 100a, and the overlap portion 100a may be the opposing overlap portion between the data line 101 and the first electrode 211 of the sub-pixel 21 in the direction perpendicular to the substrate 11.

For the connection manner of the fan-out lines 102 shown in FIG. 2, the overlap portion 1001 and its through holes may also be provided by using the technical solution of the present disclosure.

When the fan-out lines 102 are connected in the manner shown in FIG. 2, as shown in FIG. 2 to FIG. 7, the display array 20 may include multiple columns of sub-pixels 21. The first direction Y may be the column direction of the display array 20. The signal lines 100 and the display array 20 may be both located in the display area AA of the display panel. In the direction perpendicular to the signal line 100 (the second direction X), the display area AA may include a first sub-display area AA1 and a second sub-display area AA2 located between the first sub-display area AA1 and the non-display area BB. Both the first sub-display area AA1 and the second sub-display area AA2 include at least one data line 101. The signal line 100 may include a data line 101 and a first connection line 11 located in the first sub-display area AA1, and the first connection line 11 may be located between two adjacent data lines 101. The data lines 101 in the second sub-display area AA2 may be connected to the first connection lines 11 through the second connection lines 12. The first connection lines 11 may be located on the side of the display array 20 facing the substrate 11. In the direction perpendicular to the display panel, the overlap portion 100a may include a first sub-overlap portion 41 where the data line 101 overlaps with the first electrode 211 and/or a second overlap portion 42 where the first connecting line 11 overlaps with the first electrode 211. In such a manner, the first electrodes 211 of the sub-pixels 21 of the same emission color may have a relatively uniform flatness.

In one embodiment of the present disclosure, if the fan-out lines 102 are connected in the manner shown in FIG. 2, in the first sub-display area AA1, the orthographic projections of the two overlap portions 100a on the substrate 11 may be same, and the orthographic projections of the second sub-overlap portions 42 of the two overlap portions 100a on the substrate 11 may also be same. In the first sub-display area AA1, the two overlap portions 100a may include a same number of through holes. For example, the first sub-overlap portion 41 of the two overlapping portions 100a may include the same through-holes, and the second sub-overlap portion 42 of the two overlapping portions 100a may include the same through holes. In the first sub-display area AA1, the arrangement positions of the through holes of the two overlap portions 100a relative to the corresponding first electrodes 211 may be same. For example, the disposed positions of the through holes in the first sub-overlap portions 41 of the two overlap portions 100a relative to the corresponding first electrode 211 may be same, and the disposed positions of the through holes in the second sub-overlap portions 42 of the two overlap portions 100a relative to the corresponding first electrodes 211 may be same. In such a manner, in the first sub-display area AA1, the first electrodes 211 of the sub-pixels 21 of the same emission color may have a relatively uniform level of flatness.

Each sub-pixel 21 may correspond to one overlap portion 100a. When the fan-out lines 102 are connected in the manner shown in FIG. 2, in the first sub-display area AA1, each column of sub-pixels 21 may be disposed opposite to a data line 101 and a first connection line 11 in a direction perpendicular to the substrate 11. The overlap portion 100a may include a first sub-overlap portion 41 where the data line 101 overlaps with the first electrode 211 and a second sub-overlap portion 42 where the first connection line 11 overlaps with the first electrode 211. In the second sub-display area AA2, the overlap portion 100a may include the first sub-overlap portion 41 where the data line 101 overlaps with the first electrode 211.

In one embodiment of the present disclosure, in the first sub-display area AA1, the side of the sub-pixel 21 facing the substrate 11 may include a data line 101 and a first connection line 11. For the same sub-pixel 21, the first sub-overlap portion 41 and the second sub-overlap portion 42 may be symmetrically arranged at both sides of the center of the sub-pixel 21. In this way, the wiring of the data lines 101 and the first connection lines 11 in the first sub-display area AA1 and the layout of the through holes may be facilitated. In one embodiment, the data line 101 and the first connection line 11 may be set to have a same line width.

The configuration that the first sub-overlap portion 41 and the second sub-overlap portion 42 are symmetrically disposed on both sides of the center of the sub-pixel 21 may mean that, in the direction perpendicular to the display panel, the first sub-overlap portion 41 and the second sub-overlap portion 42 may be symmetrical, both may have the same shape, and may have a same number of through holes and a same layout positions of the through holes.

In the embodiment of the present disclosure, if the wiring method shown in FIG. 2 is adopted, two first conductive holes Via1 may need to be provided in the first sub-overlap portion 41 of a portion of the data lines 101, and one conductive hole Via1 may need to be provided in the first sub-overlap portion 41 of a portion of the data lines 101. For example, for the data lines 101 in the second sub-display area AA2, at least one first sub-overlap portion 41 may need to have two first conductive holes Via1, and one first conductive hole Via1 may be configured to connect the second connection line 12 to facilitate the connection with the first connection line 11 in the first sub-display area AA1, and the other first conductive hole Via1 may be configured to connect the data line 101 and the pixel circuit 12. For the data line 101 located in the first sub-display area AA1, only one first conductive hole Via1 may need to be provided in the first sub-overlap portion 41 for connecting the data line 101 and the pixel circuit 12. In the same first connection line 11, the second sub-overlap portion 101 may include a first conductive hole Via1 for connecting the second connection line 12.

To facilitate the wiring of the first connection lines 11 and at the same time make the first sub-display area AA1 have a relatively uniform flatness, a plurality of first connection lines 11 may be arranged evenly in the first sub-display area AA1. In the first direction Y, the first connection lines 11 may run through the entire display area AA.

In one embodiment of the present disclosure, the first connection line 11 and the data line 101 in the second sub-display area AA2 may be connected in a manner as shown in FIG. 2, the first connection line 11 and the connected data line 101 may be connected by a second connection line 12. At this time, for one first connection line 11, only one second sub-overlap portion 42 with the first conductive hole Via1 is required for connecting the second connection line 12 and, for one data line 101, only one first sub-overlap portion 41 may be needed to include a first conductive hole Via1 for connecting the second connection line 12.

As mentioned above, a portion of the first sub-overlap portion 41 may need to be provided with two first conductive holes Via1, which may be configured to connect the first connection line 11 and the pixel circuit 12 respectively. For the data line 101 that does not need to be connected to the first connection line 11, the first sub-overlap portion 41 of the data line 101 may only need to be provided with a first conductive hole Via1 for connecting the pixel circuit 12. For a same first connection line 11, one or more second sub-overlap portion 42 may be provided with a first conductive hole Via1 for connecting the second connection line 12.

To make different overlap portions 100a have the same through hole structure, for the same sub-pixel 21, both the first sub-overlap portion 41 and the second sub-overlap portion 42 may include two through holes. For a sub-overlap portion 41 including one first conductive hole Via1, at least one through-hole may be the first conductive hole Via1 that may be configured to connect the data line 101 and the pixel circuit 12. For the second sub-overlap portion 42 including the first conducting hole Via1, at least one through-hole may be a first through-hole Via1 that may be configured to connect the second connection line 12.

Referring to FIGS. 2-7, the first connection line 11 and the data line 101 may be located in the first metal layer 31, the second connection line 11 may be located in the second metal layer 32, and the first metal layer 31 may be located between the metal layer where the first electrode 211 is located and the second metal layer 32. For example, the first metal layer 31 and the second metal layer 32 may be arranged between the pixel circuit 12 and the sub-pixel 21. In the direction perpendicular to the substrate 11, the first metal layer 31 may be located between the sub-pixel 21 and the second metal layer 32; and the second metal layer 32 may be located between the pixel circuit 12 and the first metal layer 31. The first metal layer 31 may at least be configured to form the data line 101 and the first connection line 11, and the second metal layer 32 may at least be configured to form the second connection line 12. The first metal layer 31 may be the nearest metal layer under the metal layer where the first electrode 211 is located. When the first connection line 11 and the data line 101 are formed by using the first metal layer 31, the first conductive hole Via1 may have an impact on the flatness of the first electrodes 211. By adopting the technical solutions of the present disclosure, the first electrodes 211 of the sub-pixels 21 of at least one light-emitting color may have a relatively uniform flatness.

The pixel circuit 12 may include a plurality of transistors. The data line 101 may be connected to the source or drain of the corresponding transistor. The first electrode 211 of the sub-pixel 21 may be connected to the source or drain of the corresponding transistor. The data line 101 may be connected to the source or drain of the corresponding transistor through a wiring formed by the second metal layer 32. The wiring formed by the first metal layer 31 and the second metal layer 32 may connect the first electrode 211 of the sub-pixel 21 to the source or drain of the corresponding transistor.

The pixel circuit 12 may be a 7T1C pixel circuit including seven transistors and one storage capacitor, or an 8T1C pixel circuit including eight transistors and one storage capacitor, or other pixel circuit structures. The specific implementation of the pixel circuit 12 may not be limited.

In the embodiment of the present disclosure, as shown in FIG. 2 to FIG. 7, the pixel circuit 12 may include a transistor, and the source and drain of the transistor may be located in the third metal layer 33. The third metal layer 33 may be located between the second metal layer 32 and the substrate between 11. In such a way, not only the first connection line 11 and the data line 101 may be formed from the first metal layer 31 and the second connection line 12 may be formed from the second metal layer 32, but also the first metal layer 31 and the second metal layer 32 may be used to form the wirings and the conductive holes to realize the electrical connection between the transistors in the pixel circuit 12 and the first electrode 211, and the electrical connection between the transistors in the pixel circuit and the data line 101. Accordingly, the layout of the display panel may be realized by a small number of metal layers.

In one embodiment of the present disclosure, as shown in FIG. 2 to FIG. 7, a first organic layer 14 may be disposed between the first metal layer 31 and the sub-pixel 21, and a second organic layer 15 may be disposed between the first metal layer 31 and the second metal layer 32. By arranging the first organic layer 14 between the first metal layer 31 and the sub-pixel 12, the sub-pixel 21 may be ensured to have a relatively flat surface. By disposing the second organic layer 15 between the first metal layer 31 and the second metal layer, the first metal layer 31 may be ensured to have a relatively flat surface.

As mentioned above, limited by the formation process of the organic layer and the exposure amount of the conductive hole connected to the first electrode 211, the first organic layer 14 with a relatively large thickness may not completely guarantee the first electrode 211 to have better flatness. Based on this, using the technical solution of the present disclosure, setting the overlap portions 100a to have the same orthographic projection on the substrate 11 may improve the uniformity of the flatness of the first electrodes 211. Accordingly, in the sub-pixels 21 of the same emission color, the flatness of the first electrodes of different sub-pixels 21 may be same or similar, and the problem of color shift may be solved.

As described above, for sub-pixels 21 of the same light-emitting color, to further improve the uniformity of the flatness of the first electrodes 211, in at least two overlap portions 100a, the side of the overlap portion 100a facing the substrate 11 may be further provided with an auxiliary holes Via'. The second organic layer 15 may be disposed between the first metal layer 31 and the second metal layer 32, and the auxiliary hole Via' and the first conductive hole Via1 may be formed based on the second organic layer 15. In one embodiment, the depth of the auxiliary hole Via' may be not less than the thickness of the second organic layer 15. When the depth of the auxiliary hole Via' is not less than the thickness of the second organic layer 15, the auxiliary hole Via' may pass through the second organic layer 15. As shown in FIG. 5 and FIG. 7, the depth of the auxiliary hole Via' may be set equal to the thickness of the second organic layer 15. The depth of the auxiliary hole Via' may also be set to be greater than the thickness of the second organic layer 15.

In the embodiment of the present disclosure, as shown in FIG. 4 and FIG. 6, the display array 20 may include three types of sub-pixels 21 with different emission colors. The three types of sub-pixels 21 may include a first sub-pixel 01, a second sub-pixel 02 and a third sub-pixel 03. The sub-pixels 21 of the same emission color may be filled with the same pattern for illustration. For example, all the first sub-pixels 01 are filled with the same size and pattern, all the second sub-pixels 02 are filled with the same size and pattern, and all the third sub-pixels 03 are filled with the same size and pattern. In one embodiment, the first sub-pixel 01 may emit blue light, the second sub-pixel 02 may emit red light, and the third sub-pixel 03 may emit green light.

Figure 8:
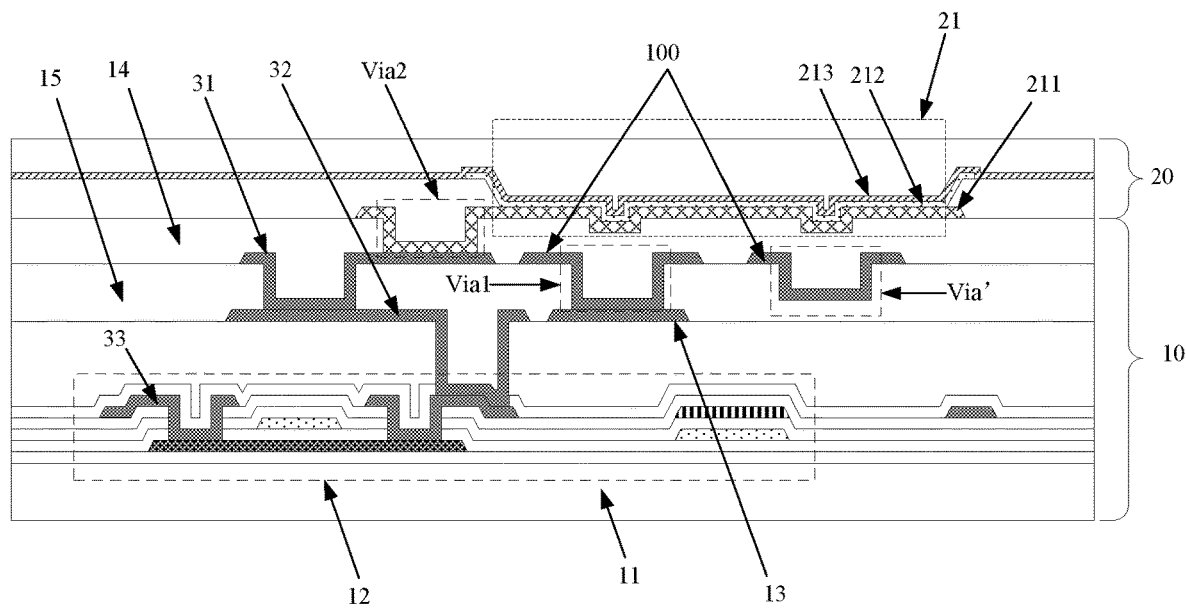
FIG. 8 illustrates another exemplary A-A sectional view of the display panel in FIG. 6.

In other manners, the cross-sectional view of the display panel may also be as shown in FIG. 8. The depth of the auxiliary hole Via' may be smaller than the thickness of the second organic layer FIG. 8 is another exemplary A-A-sectional view of the display panel in FIG. 6. As shown in FIG. 8, the difference from the manner shown in FIG. 5 and FIG. 7 may include that, in the structure shown in FIG. 8, the auxiliary hole Via' may not pass through the second organic layer 15, the depth of the auxiliary hole Via' may be less than the thickness of the second organic layer 15, and the bottom of the auxiliary hole Via' may be located in the second organic layer 15.

Figure 9:
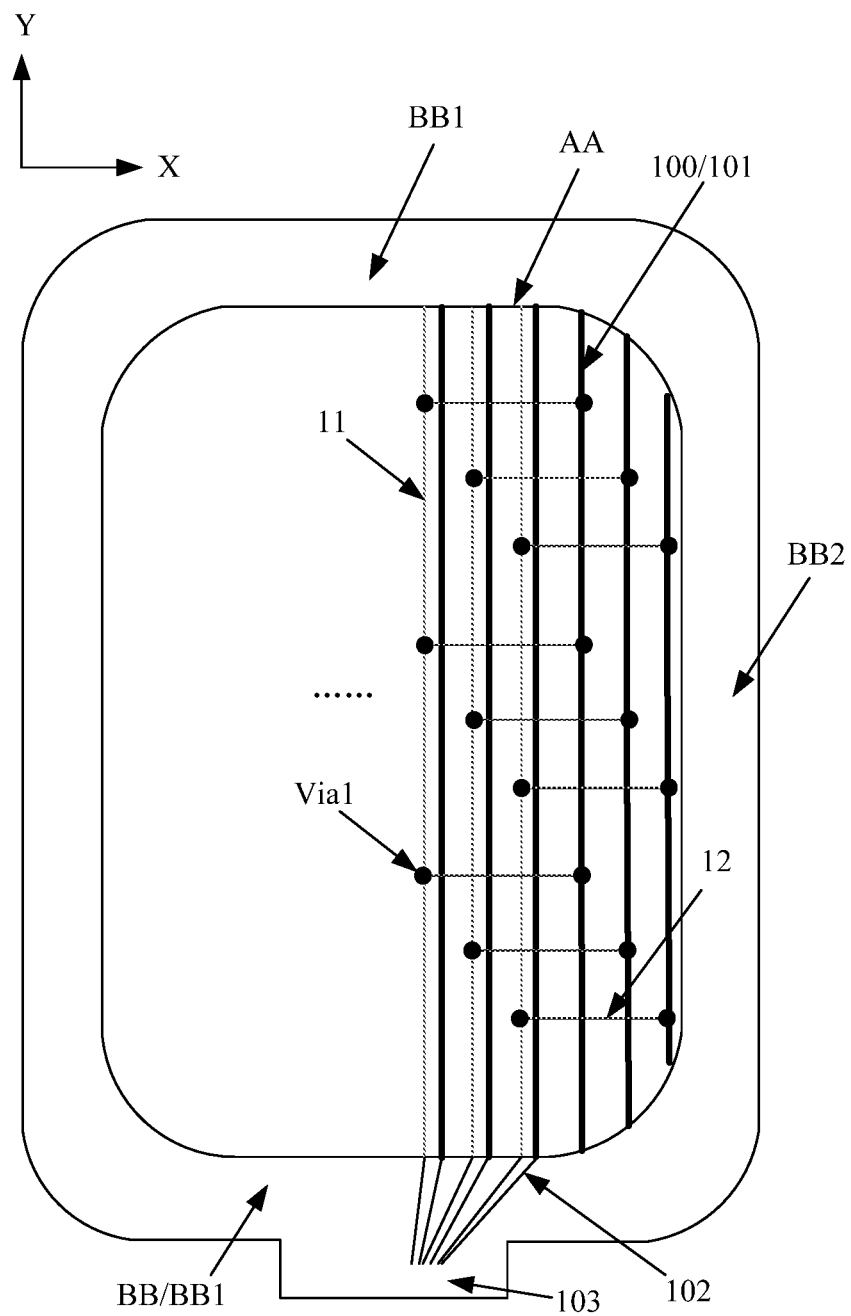
FIG. 9 illustrates another exemplary display panel according to various disclosed embodiments of the present disclosure.

To reduce the impedance and compensate the electrical signal attenuation of the data line 101 in the second sub-display area AA2 due to the connection of the first connection line 11, the wiring layout in the display panel may also be set as shown in FIG. 9.

FIG. 9 is a schematic structural diagram of another exemplary display panel provided by an embodiment of the present disclosure. The difference from the structure shown in FIG. 2 may include that, in the structure shown in FIG. 9, the first connection line 11 and the data lines 101 may be connected by a plurality of second connection lines 12. At this time, for one first connection line 11, the plurality of second sub-overlap portions 42 may include first conductive holes Via1 for connecting the second connection lines 12; and for one data line 101, the plurality of first sub-overlap portions 41 may include the first conductive hole Via1 for connecting the second connection line 12.

In the manner shown in FIG. 9, to ensure that different areas in the display area AA may have a relatively uniform flatness, the second connection lines 12 may be set to be evenly distributed in the display area AA.

Figure 10:
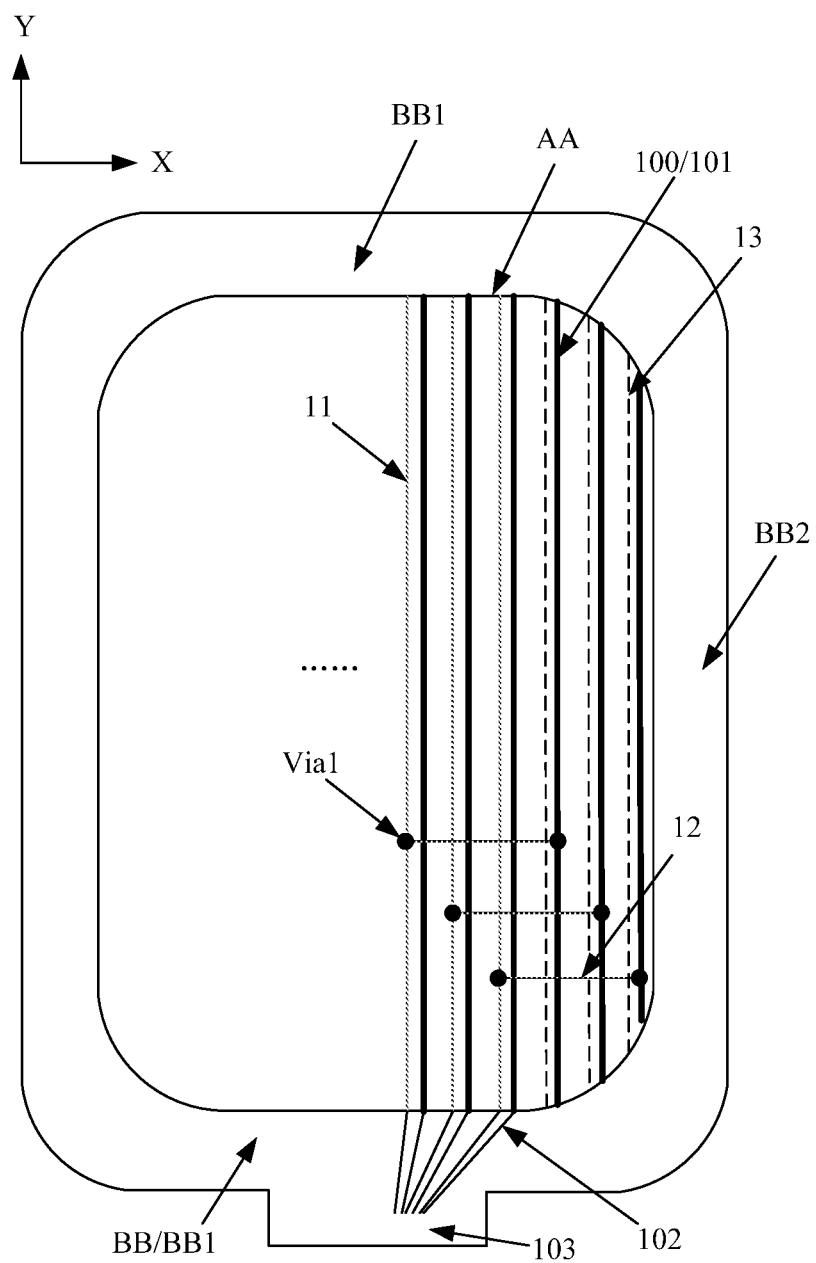
FIG. 10 illustrates another exemplary display panel according to various disclosed embodiments of the present disclosure.

FIG. 10 is a schematic structural diagram of another exemplary display panel provided by an embodiment of the present disclosure. The difference from the structure shown in FIG. 2 may include that, in the structure shown in FIG. 10, the signal line 100 may further include a third connection line 13. The third connection line 13 may be located in the second sub-display area AA2 and may extend in the same direction as the first connection line 11. In the second sub-display area AA2, the overlap portion 100a may include the first sub-overlap portion 41 formed by overlapping the data line 101 and the first electrode 211 and the third sub-overlap portion formed by the overlapping of the third connection line 13 and the first electrode 211.

Implementation of the third sub-overlap portion and the implementation of the second sub-overlap portion 42 in the first sub-display area AA1 may be the same. For the structure of the third sub-overlap portion, reference may be made to the second sub-overlap portion 42 in the manners shown in FIG. 4 and FIG. 6. In the embodiments of the present disclosure, no separate illustration and description will be made.

By arranging the third connection line 13 in the second sub-display area AA2, it may be possible to solve the problem of the difference in the flatness of the first electrodes 211 in the first sub-display area AA1 and the second sub-display area AA2 caused by disposing the first connection lines 11 in the first sub-display area AA1.

To facilitate the layout of the wirings, the third connection line 13 and the first connection line 11 may be located on the same metal layer. To better improve the uniformity of the flatness of the first electrodes 211 in the first sub-display area AA1 and the second sub-display area AA2, the distribution density of the first connection lines 11 in the first sub-display area AA1 and the distribution density of the third connection lines 13 in the second sub-display area AA2 may be set same.

The third connection line 13 may be connected to a predetermined fixed potential to prevent the inductive potential of the third connection line 13 caused by the floating of the third connection line, thereby avoiding the influence on the performance of the display panel.

Figure 11:
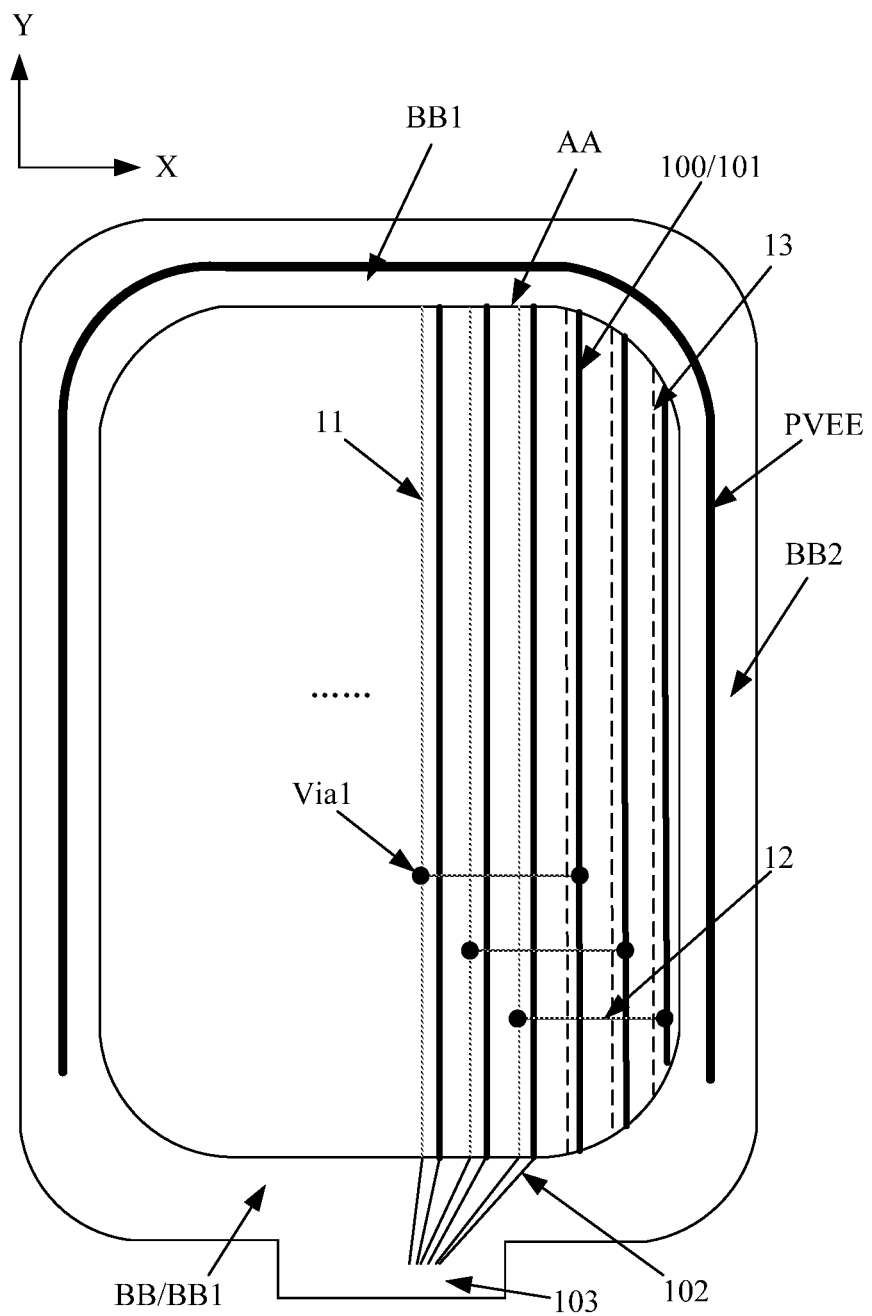
FIG. 11 illustrates another exemplary display panel according to various disclosed embodiments of the present disclosure.

FIG. 11 is a schematic structural diagram of another exemplary display panel provided by an embodiment of the present disclosure. As shown in FIG. 11, the display panel may include a non-display area BB surrounding the display area AA. The non-display area BB may include a power supply line PVEE surrounding at least a portion of the display area AA. The third signal line 13 may be connected to the power supply line PVEE. The power supply line PVEE may be configured to provide the second electrode 213 of the sub-pixel 21 with a DC low level such that the sub-pixel 21 may perform light-emitting display. The power supply line PVEE surrounding at least a portion of the display area AA disposed in the non-display area BB may not only be configured to provide a low DC level for the second electrode 213 of the sub-pixel 21 to control the sub-pixel 21 to emit light and display, but also may be configured to be multiplexed as an electrostatic shielding line to prevent the static electricity from causing damage to the conductive structures in the display area AA.

The third connection line 13 may be set to be connected to the power supply line PVEE through the fourth connection line. The fourth connection line and the data line 101 may be disposed at different metal layers such that the fourth connection line and the data line 101 may be insulated and crossed. In one embodiment, the fourth connection line may be arranged on the second metal layer 32. The fourth connection line may be parallel to the extending direction of the second connection line 12x.

In one embodiment of the present disclosure, the display array 20 may include a first sub-pixel, a second sub-pixel and a third sub-pixel with different emission colors. The pixel aperture of the first sub-pixel may be greater than the pixel aperture of the second sub-pixel, and the pixel aperture of the second sub-pixel may be greater than the pixel aperture of the third sub-pixel. The overlap portions 100a corresponding to the first electrode 211 of at least a portion of the first sub-pixels and/or a portion of the second sub-pixels may include a first conductive hole Via1, and the orthographic projections of the first conductive holes on the substrate 11 may be same.

As mentioned above, because the first conductive hole Via1 may be located in the organic layer and may include a large aperture, the pixel aperture of the sub-pixel 21 may not be completely avoided. Therefore, setting the overlap portions 100a corresponding the first sub-pixels and/the portion of the second sub-pixels with larger pixel aperture to include the first conductive hole Via1 may facilitate the overlap portions 100a to have a large enough area to meet the requirements of the orthographic projection. At the same time, the overlapping of the third sub-pixel with the smallest pixel aperture and the first conductive hole Via1 may be avoided, thereby avoiding that the overlap portion 100a may not meet the requirements for orthographic projection due to the small area of the overlap portions 100a.

In one embodiment of the present disclosure, the configuration that the orthographic projections of the overlap portions 100 corresponding to the sub-pixels 21 of the same emission color on the substrate 11 are same may include at least one of the following approach: the orthographic projections of the overlap portions 100 corresponding to different first sub-pixels on the substrate 11 may be same, the orthographic projections of the overlap portions 100 corresponding to different second sub-pixels on the substrate 11 may be the same, and the orthographic projections of the overlap portions 100 corresponding to different third sub-pixels on the substrate 11 may be same.

The first sub-pixel may be a blue OLED element, the second sub-pixel may be a red OLED element, and the third sub-pixel may be a green OLED element. In the OLED display panel, based on the luminous efficiency of the organic light-emitting layer in the OLED elements of different light-emitting colors and the arrangement of each OLED element, the pixel aperture size of the OLED light-emitting element may be correspondingly set. Generally, the pixel aperture of the blue OLED element may be set to be the largest, and the pixel aperture of the green OLED element may be set to be the smallest.

In this embodiment of the present disclosure, as shown in FIG. 6, the overlap portions 100a corresponding to the first sub-pixels may all have the first conductive holes Via1, and their orthographic projections on the substrate 11 may be same. Accordingly, for the first conductive hole with the largest pixel aperture, the sub-pixels may make the first electrodes 211 of different first sub-pixels have a relatively consistent flatness, thereby solving the display color shift problem of the first sub-pixels.

In the manner shown in FIG. 6, the overlap portions 100a corresponding to the first sub-pixels may have the same orthographic projections on the substrate 11 and may be provided with an auxiliary hole Via'. The overlap portions 100a corresponding to the third sub-pixels may have the same orthographic projection on the substrate 11, the first conductive hole Via1 and the overlap portion 100a may not overlap, and there may be no need to provide an auxiliary hole. The overlap portions 100a corresponding to the second sub-pixel may have the same orthographic projection on the substrate 11, and a portion of the overlap portions 100a may include a first conductive hole Via1, and no auxiliary hole may be provided.

Figure 12:
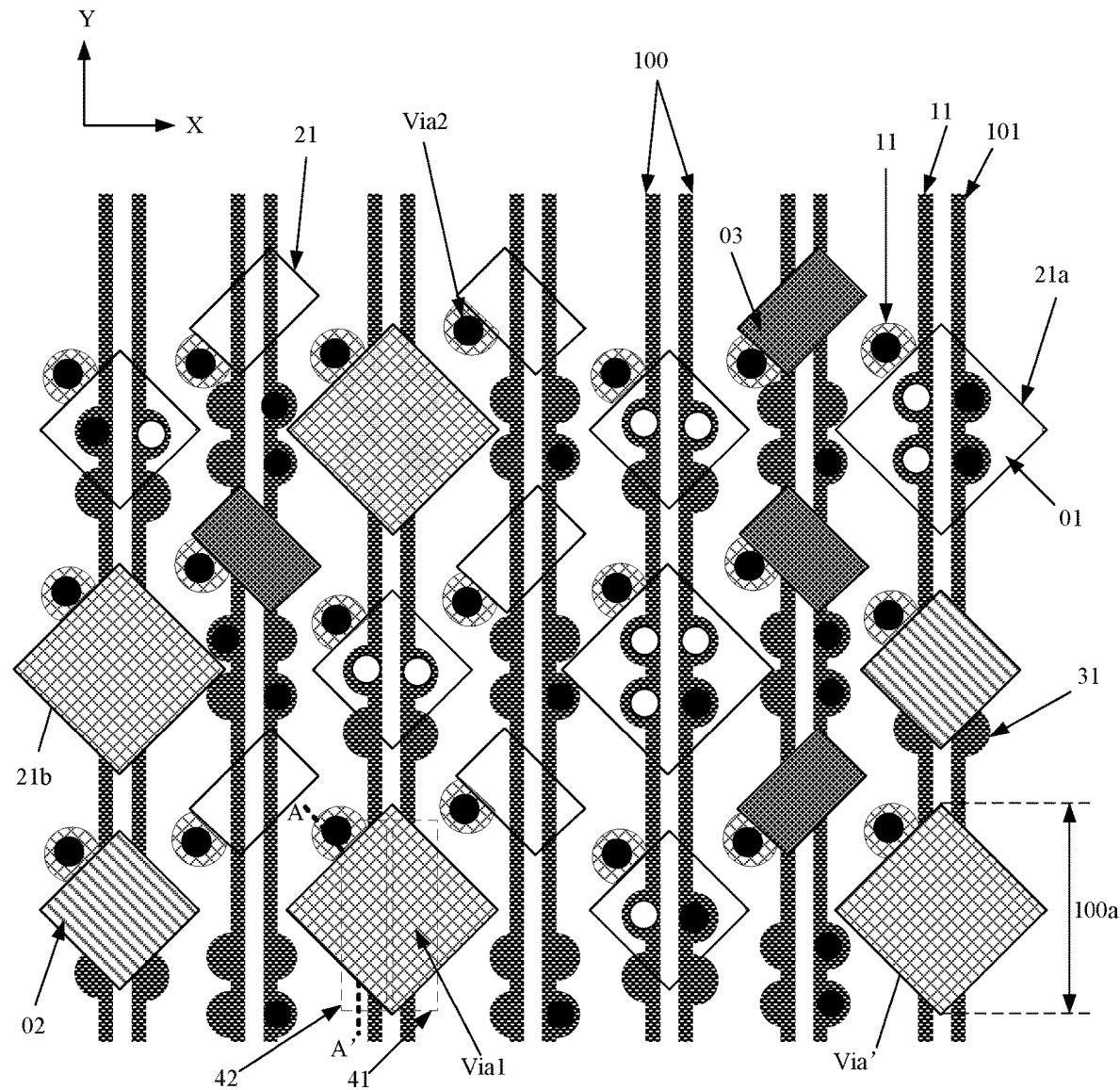
FIG. 12 illustrates a layout of signal lines and sub-pixels of another exemplary display panel according to various disclosed embodiments of the present disclosure.

To further improve the uniformity of the flatness of the first electrodes 211 of different second sub-pixels, as shown in FIG. 12, the overlap portions 100 corresponding to the second sub-pixels may also be set to have auxiliary holes Via', which may make the first electrode 211 of different second sub-pixels have a relatively uniform flatness to solve the display color shift problem of the second sub-pixels.

FIG. 12 is a schematic diagram of another layout of signal lines and sub-pixels in another exemplary display panel provided by an embodiment of the present disclosure. On the basis of the structure shown in FIG. 6, this configuration may further set the overlap portions 100a corresponding to the second sub-pixel 02 to have auxiliary holes Via' such that the overlap portions 100a corresponding to different second sub-pixels 02 may include the same number of through holes and a same layout of through hole. As shown in FIG. 12, based on the space in the display panel, for the overlap portions 100a corresponding to the second sub-pixels 02, some overlap portions 100a may be set to include to two auxiliary holes Via', and some overlap portions 100a may be set to include one first conductive hole Via1 and one auxiliary hole Via'.

In one embodiment of the present disclosure, the first sub-pixel 01 and/or the second sub-pixel 02 may all include auxiliary holes Via', and for the third sub-pixel 03 with the smallest pixel aperture, the first through hole Via1 in the signal line 100 may be disposed between the third sub-pixels 03. For example, the overlap portion 100a corresponding to the third sub-pixel 03 may not overlap with the first conductive hole Via1 in the signal line 100.

Figure 13:
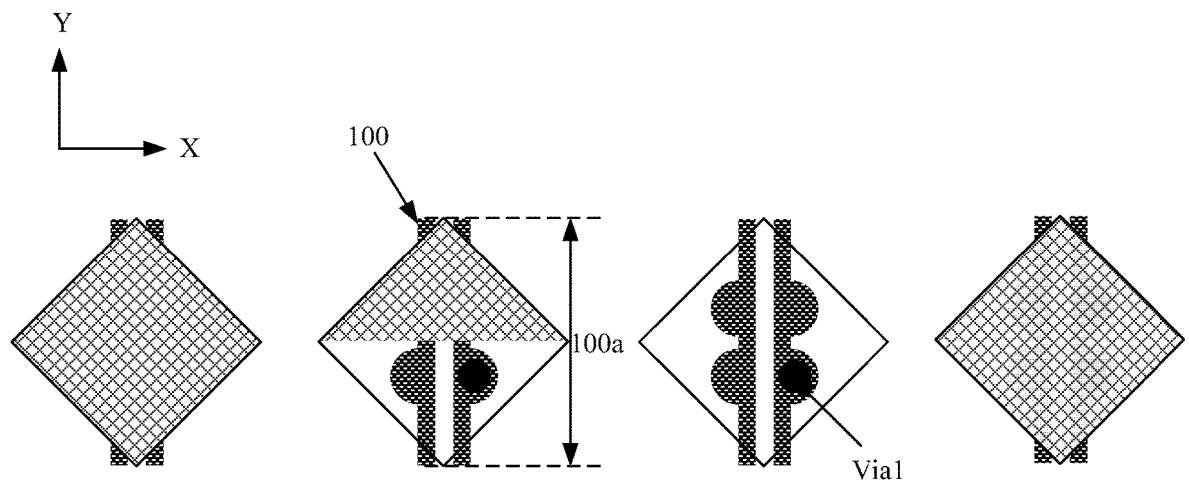
FIG. 13 illustrates an exemplary structure of the overlap portions corresponding to a plurality of sub-pixels continuously distributed in a same row according to various disclosed embodiments of the present disclosure.

FIG. 13 is a schematic structural diagram of overlapping portions corresponding to a plurality of first sub-pixels and continuously arranged in the same row according to an embodiment of the present disclosure. As shown in FIG. 13, in the first sub-pixels in the same row, the orthographic projections of the overlapping portions 100a corresponding to the respective first sub-pixels on the substrate 11 may be same. In such a manner, in the same row, because the overlap portions 100 corresponding to all the first sub-pixels may have the same orthographic projection, the first electrodes 211 of the first sub-pixels in the same row may have a relatively uniform flatness such that the first electrodes 211 in the same row and corresponding to the same gray scale may have the same light-emitting effect.

In the structure shown in FIG. 13, in the overlap portion 100a corresponding to the same first sub-pixel, the right signal line 100 may be the data line 101, and the left signal line 100 may be the first connection line 11 or the third connection line 13. Each of the overlap portions 100a may include a first conductive hole Via1 for connecting the pixel circuit 12. For the rightmost overlap portion 100a, another first conductive hole Via1 located on the data line 101 may be configured to connect the first connection line 11 in the first sub-display area AA1. For the leftmost overlap portion 100a, the signal line 100 on the left may be the first connection line 11 for connecting the data line 101 in the second sub-display area AA2.

Figure 14:
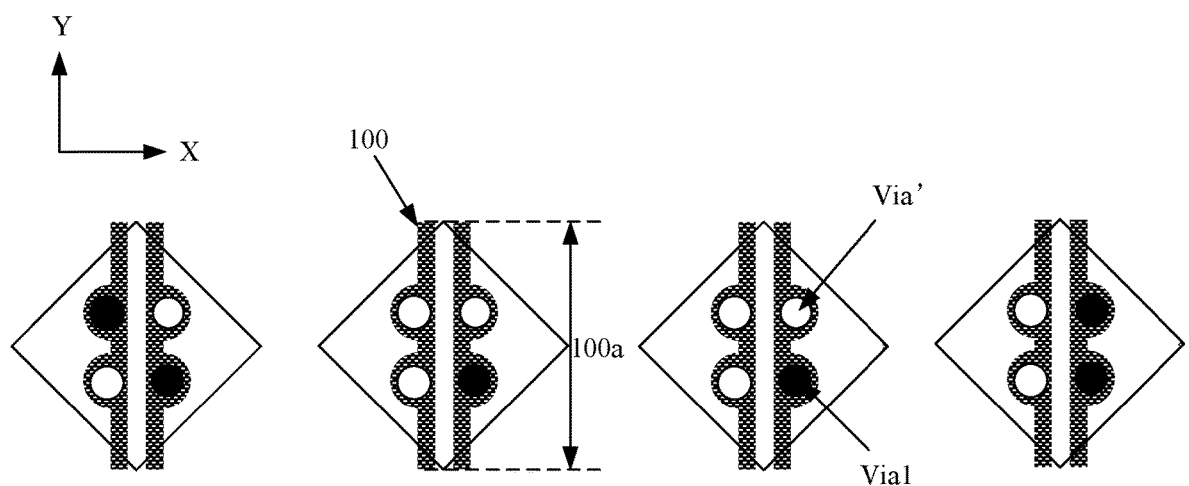
FIG. 14 illustrates another exemplary structure of the overlap portions corresponding to a plurality of sub-pixels continuously distributed in a same row according to various disclosed embodiments of the present disclosure.

As described above, for the first sub-pixels, in order to further improve the uniformity of the flatness of the first electrodes 211 of different first sub-pixels, while setting the overlap portions 100a corresponding to different first sub-pixels to have the same orthographic projection on the substrate 11, it may be also possible to set different overlap portion 100a to have auxiliary holes Via', and set different overlap portions 100a to have the same number and same layout of through holes, as shown in FIG. 14.

FIG. 14 is a schematic structural diagram of another exemplary overlap portion corresponding to a plurality of first sub-pixels continuously arranged in the same row according to an embodiment of the present application. As shown in FIG. 14, on the basis of the structure shown in FIG. 13, in the structure shown in FIG. 14, in the first sub-pixels in the same row, each overlap portion 100a corresponding to the first sub-pixel may include an auxiliary holes Via' such that different overlap portions 100a may have the same number of through holes and may have a same layout of through holes.

Figure 15:
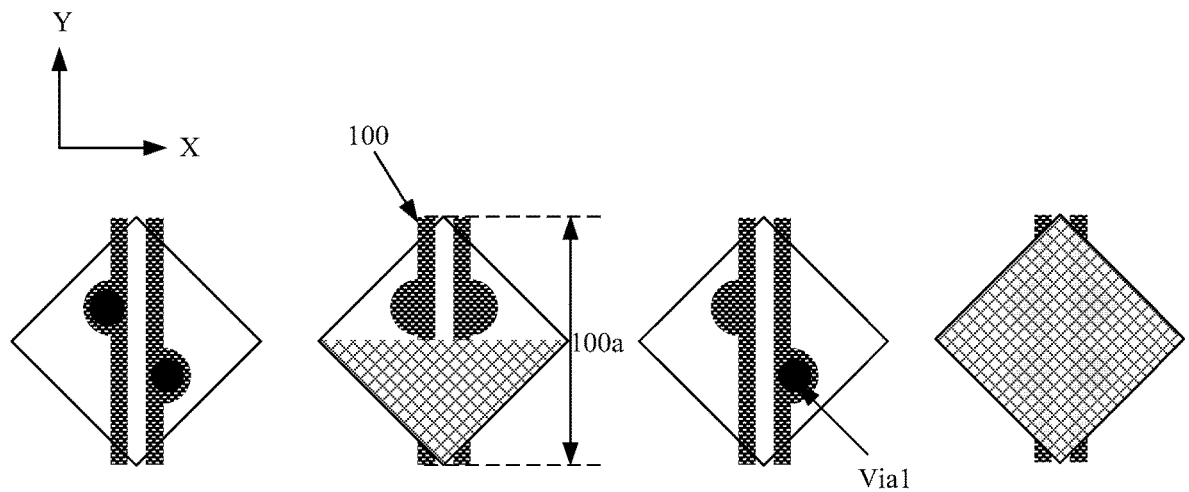
FIG. 15 illustrates another exemplary structure of the overlap portions corresponding to a plurality of sub-pixels continuously distributed in a same row according to various disclosed embodiments of the present disclosure.

FIG. 15 is a schematic structural diagram of another overlap portion corresponding to a plurality of first sub-pixels continuously arranged in the same row provided by an embodiment of the present disclosure. As show in FIG. 15, in one embodiment, for the overlap portions 100a corresponding the first sub-pixels in the same row, the orthographic projections of the adjacent two overlap portions 100a on the substrate 11 may be different, and the orthographic projections of the next two adjacent overlap portions 100a on the substrate 11 may be same. In such a manner, for the first sub-pixels in the same row, the overlap portions 100a corresponding to the first sub-pixels located in the odd-numbered columns may have the same orthographic projection, and the overlap portions 100a corresponding to the first sub-pixels located in the even-numbered columns may have the same orthographic projection. The orthographic projections of the overlap portions 100a corresponding to the first sub-pixels located in the odd-numbered columns and the orthographic projections of the overlap portions 100 corresponding to the first sub-pixels located in the even-numbered columns may be different. In such manner, in the same row, because the overlap portions 100a corresponding to the first sub-pixels located in the even-numbered columns may have the same orthographic projection, the first electrodes 211 of the first sub-pixels located in the even-numbered columns may have a relatively consistent flatness, the light-emitting effect corresponding to the same grayscale may be same. Further, because the overlap portions 100 corresponding to the first sub-pixels located in the odd-numbered columns may have the same orthographic projection, the first electrodes 211 of the first sub-pixels located in the odd-numbered columns may have a relatively consistent flatness, and the light-emitting effect corresponding to the same grayscale may be same.

In the manner shown in FIG. 15, in the overlap portions 100a corresponding to the same first sub-pixel, the right signal line 100 may be the data line 101, and the left signal line 100 may be the first connection line 11 or the third connection line 13. Each of the overlap portions 100a may include a first conductive hole Via1 for connecting the pixel circuit 12. For the rightmost overlap portion 100a, another first conductive hole Via1 located on the data line 101 may be configured to connect the first connection line 11 in the first sub-display area AA1. For the leftmost overlap portion 100a, the signal line 100 on the left may be the first connection line 11 for connecting the data lines 101 in the second sub-display area AA2.

Figure 16:
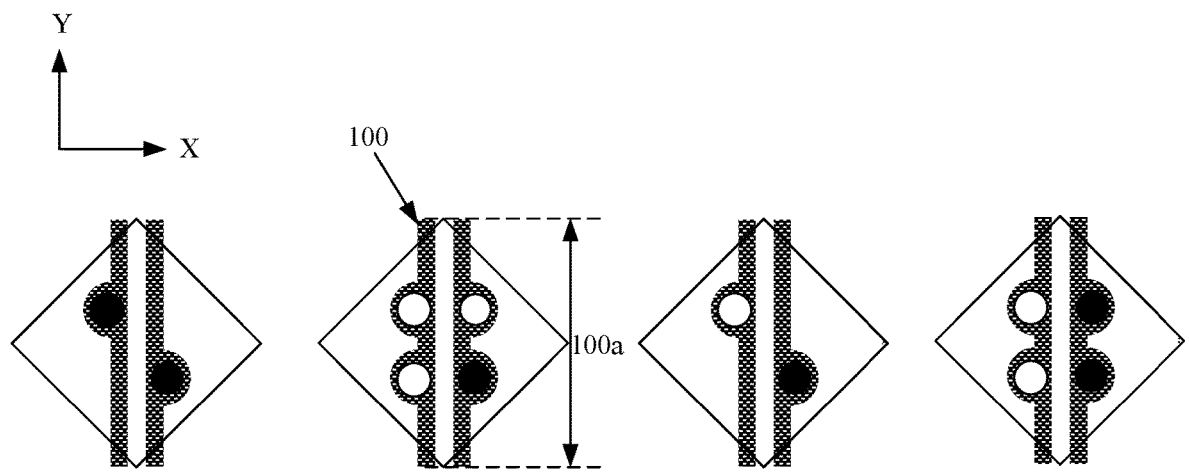
FIG. 16 illustrates another exemplary structure of the overlap portions corresponding to a plurality of sub-pixels continuously distributed in a same row according to various disclosed embodiments of the present disclosure.

On the basis of the manner shown in FIG. 15, to further improve the uniformity of the flatness of the first electrodes 211 of different first sub-pixels, as shown in FIG. 16, different overlap portions 100a may be provided with auxiliary holes Via', and different overlap portions 100a may be provided with the same number of auxiliary holes Via', and a same layout of auxiliary holes Via'.

FIG. 16 is a schematic structural diagram of another overlap portion corresponding to a plurality of first sub-pixels continuously arranged in the same row provided by an embodiment of the present disclosure. As shown in FIG. 16, on the basis of the manner shown in FIG. 15, in the manner shown in FIG. 16, for the first sub-pixels in the same row, the overlap portions 100a corresponding to the next adjacent first sub-pixels may not only have the same orthographic projection on the substrate 11, but also may have auxiliary holes Via'. Accordingly, the overlap portions 100a may have the same number of through holes and the same layout of through holes.

As shown in FIG. 4, FIG. 6 and FIG. 12, the orthographic projections of the overlap portions 100a corresponding to the second sub-pixels on the substrate 11 may be the same. In such a manner, the first electrodes 211 of different second sub-pixels may have a relatively consistent flatness, thereby solving the display color shift problem of the second sub-pixels.

In one embodiment, for the overlap portions 100a corresponding to the second sub-pixels in the same row, the orthographic projections of the adjacent two overlap portions 100a on the substrate 11 may be different, and the orthographic projections of the next two adjacent overlap portions 100a on the substrate 11 may be same. The structure of this manner may be the same as the implementation principle of the structure shown in FIG. 15 and FIG. 16 for the overlap portion 100*a* corresponding to the first sub-pixel, and is not illustrated in the embodiment of the present disclosure.

The principle that the technical solutions of the embodiments of the present disclosure can solve the display color shift of the sub-pixels of the same emission color will be described below with reference to the light path diagrams of the screenshots.

Figure 17:
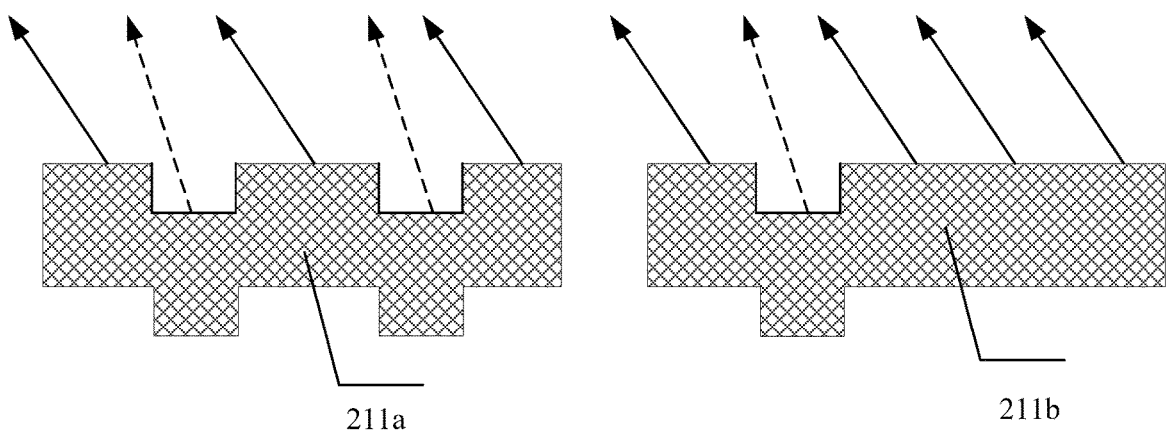
FIG. 17 illustrates a mechanism of the color shift caused by level degrees of first electrodes of sub-pixels of a same emission color.

FIG. 17 is a schematic diagram showing the principle of the display color shift caused by inconsistent flatness of the first electrodes of the sub-pixels of the same emission color. As shown in FIG. 17, for two sub-pixels 21 of the same emission color, there are a first electrode 211*a* and a first electrode 211*b* respectively. The flatness of the first electrode 211*a* and the first electrode 211*b* are different. For example, the first electrode 211*a* includes two micro-recessed structures, and the first electrode 211*b* include one micro-recessed structure. Under a same viewing angle, the direction and intensity of the light emitted from the micro-recessed structures and the light emitted from the area outside the micro-recessed structures are different. The dashed arrows represent the light emitted from the area of the micro-recessed structure, and the solid arrows represent the emitted light from the area outside the micro-recessed structures. As shown in the left picture and the right picture in FIG. 17, due to the inconsistent flatness of the first electrode 211*a* and the first electrode 211*b*, under the same viewing angle, the reflection effect on the light emitted by the sub-pixel 21 is inconsistent, resulting in a display color shift issue.

Figure 18:
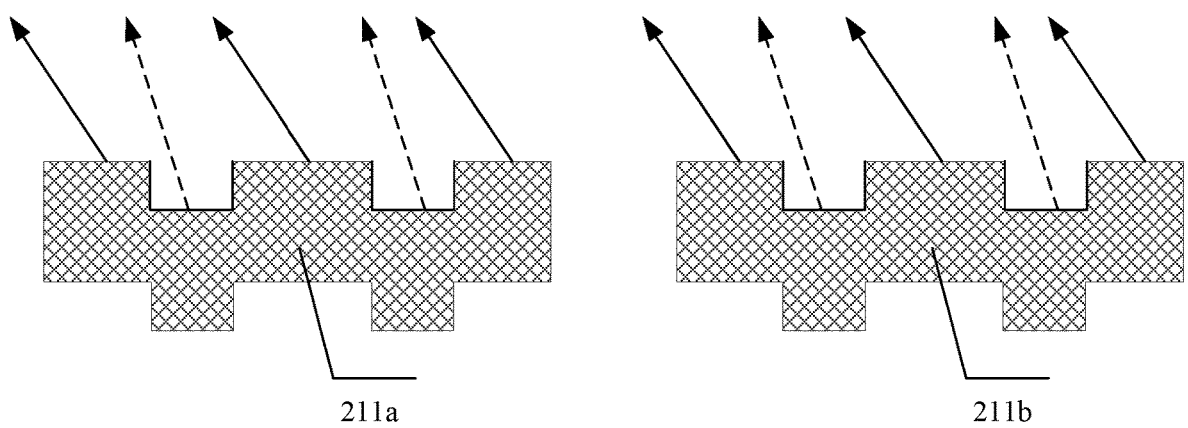
FIG. 18 illustrates an exemplary mechanism for solving the color shift of sub-pixels of a same emission color according to various disclosed embodiments of the present disclosure.

FIG. 18 is a schematic diagram of the principle of solving the display color shift of the sub-pixels of the same light-emitting color according to various disclosed embodiments of the present disclosure. As shown in FIG. 18, in one embodiment, by setting the overlapping portions 100*a* of the sub-pixels 21 of a same emission color to have a same orthographic projection on the substrate 11, the uniformity of the flatness of the first electrodes 211 of the sub-pixels of the same light-emitting color may be improved. Further, by setting the overlap portions 100*a* to have the same number of through holes and the same layout of the through holes, the uniformity of the flatness of the first electrodes 211 of the sub-pixels of the same light-emitting color may be further improved. As shown in the left and right figures in FIG. 18, because the technical solution of the present disclosure may make the first electrode 211*a* and the first electrode 211*b* have a relatively consistent flatness, when the same brightness is displayed at the same viewing angle, the display effect may be consistent; and the problem of display color shift of the sub-pixels 21 of the same emission color may be solved.

The present disclosure also provides an electronic device. A corresponding electronic device is shown in FIG. 19.

Figure 19:
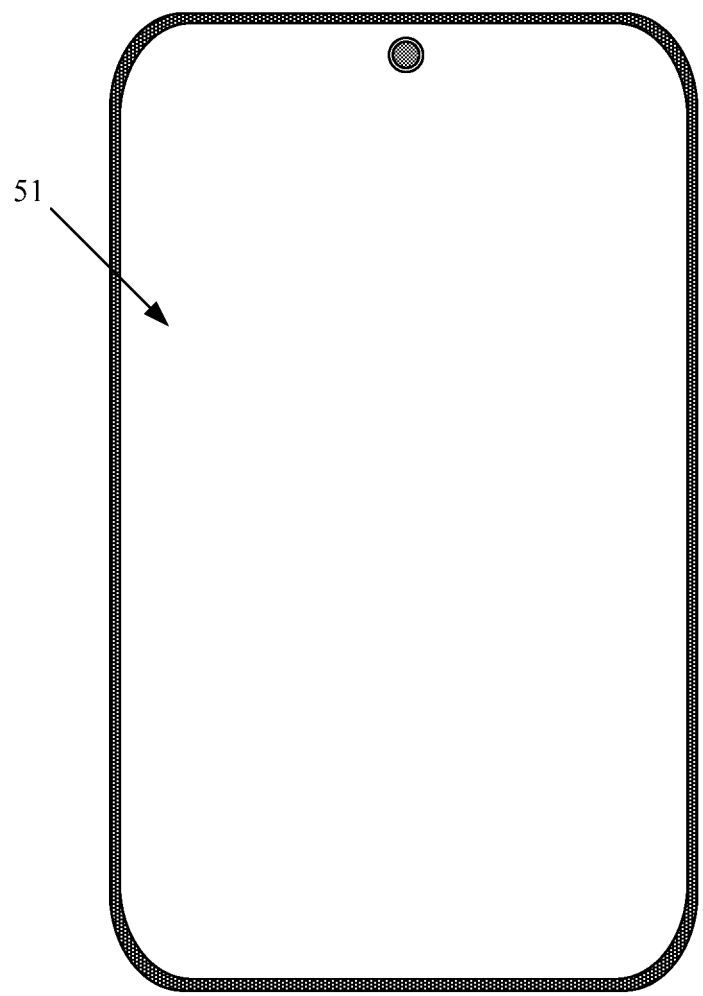
FIG. 19 illustrates an exemplary electronic device according to various disclosed embodiments of the present disclosure.

FIG. 19 is a schematic structural diagram of an exemplary electronic device provided by an embodiment of the present disclosure. The electronic device may include a display panel 51 provided in any of the above-mentioned embodiments, or other appropriate display panel.

In one embodiments of the present disclosure, the electronic device may include a smart phone, a tablet computer, a smart wearable device, a home appliance, and other electronic device including an OLED display panel. The electronic device may adopt the display panel 51 provided in the above-mentioned embodiments such that, in the sub-pixels 21 of the same emission color, the first electrodes 211 of different sub-pixels 21 may have the same flatness. Therefore, when the viewing angle is small, the corresponding same gray scale may have the same chromaticity and brightness, the color shift problem at the viewing angle may be avoided.

Thus, in the display panel and the electronic device provided by the technical solution of the present disclosure, the signal line may include overlap portions corresponding to the sub-pixels, and at least two overlap portions may correspond to the sub-pixels of the same emission color and may include the first conductive holes. The orthographic projections of the at least two overlap portions on the substrate may be same such that the first electrodes of the sub-pixels corresponding to the at least two overlap portions may have a same or similar flatness. Accordingly, when the sub-pixels of the same emission color displayed under the same viewing angle, they may have the same display effect, the display color shift issue of the sub-pixels of the same emission color may be solved, and the image display quality may be improved.

The various embodiments in this specification are described in a progressive manner, or in parallel, or in a combination of progressive and juxtaposed. Each embodiment focuses on the differences from other embodiments, and the same and similar parts between the various embodiments are mutually refereed. For the electronic device disclosed in the embodiment, because it may correspond to the display panel disclosed in the embodiment, the description is relatively simple, and the relevant part may be referred to the description of the display panel.

It should be noted that, in the description of the present disclosure, it should be understood that the drawings and descriptions of the embodiments are illustrative rather than restrictive. The same drawing numbers identify the same structures throughout the embodiments of the specification. Additionally, the drawings may exaggerate the thickness of some layers, films, panels, regions, etc., for understanding and ease of description. It will also be understood that when an element, such as a layer, film, region or substrate, is referred to as being "on" another element, it can be directly on the other element or intervening elements may be present. In addition, "on" refers to positioning an element on or below another element, but does not essentially refer to positioning on an upper side of another element according to the direction of gravity.

The orientation or positional relationship indicated by the terms "upper", "lower", "top", "bottom", "inner", or "outer", etc. is based on the orientation or positional relationship shown in the drawings, and is only for the convenience of describing the present disclosure and to simplify the description, rather than to indicate or imply that the device or element referred to must have a particular orientation, be constructed and operate in a particular orientation, and therefore should not be construed as limiting the disclosure. When a component is said to be "connected" to another component, it can be directly connected to the other component or there may be a centered component at the same time.

It should also be noted that in this disclosure, relational terms, such as first and second, are used only to distinguish one entity or operation from another, and do not necessarily require or imply those entities or operations have such actual relationship or order between them. Moreover, the terms "comprising", "including" or any other variation thereof are intended to encompass a non-exclusive inclusion, whereby an article or device comprising a list of elements includes not only those elements, but also other elements not expressly listed, or also include elements inherent to the article or equipment. Without further limitation, an element defined by the phrase "comprising a . . . " does not preclude the presence of additional identical elements in an article or device that includes the above-mentioned element.

The above description of the disclosed embodiments enables any person skilled in the art to make or use the present disclosure. Various modifications to these embodiments will be readily apparent to those skilled in the art, and the generic principles defined herein may be implemented in other embodiments without departing from the spirit or scope of the present application. Therefore, this disclosure is not intended to be limited to the embodiments shown herein, but is to be accorded the widest scope consistent with the principles and novel features disclosed herein.

What is claimed is:

1. A display panel, comprising:
   an array substrate, including a substrate, a pixel circuit disposed on the substrate, and a plurality of signal lines distributed in parallel and disposed on a side of the pixel circuit away from the substrate, wherein the plurality of signal lines are connected to wirings below the plurality of signal lines through first conductive holes; and
   a display array, including a plurality of sub-pixels and located on a side of the plurality of signal lines away from the substrate,
   wherein:
   in a direction perpendicular to the substrate, the plurality of signal lines include overlap portions overlapping with first electrodes of the plurality of sub-pixels;
   at least two overlap portions correspond to sub-pixels of a same emission color of the plurality of sub-pixels and include first conductive holes; and
   orthographic projections of the at least two overlap portions on the substrate are same.

2. The display panel according to claim 1, wherein:
   a side of the overlap portions facing the substrate also includes an auxiliary hole; and
   the auxiliary holes are disconnected from a metal layer below the plurality of signal lines.

3. The display panel according to claim 2, wherein:
   in a direction parallel to the substrate, one side of an overlap portion of the overlap portions includes a protruding structure; and
   an auxiliary hole and a first conductive hole are respectively located on a side of the protruding structure facing the substrate.

4. The display panel according to claim 2, wherein:
   among the at least two overlap portions, different overlap portions include a same number of through holes; and
   the same number of through holes include the auxiliary hole and the first conductive hole.

5. The display panel according to claim 4, wherein:
   among the at least two overlap portions, in a direction perpendicular to the substrate, positions of the same number of through holes of different overlap portions relative to the corresponding first electrodes are same.

6. The display panel according to claim 1, wherein the display array comprises:
   multiple columns of sub-pixels,
   wherein the signal line includes a plurality of data lines, and the pixel circuits connected to a column of the sub-pixels of the multi columns of sub-pixels are correspondingly connected to one of the data lines, and the data line is disposed below the column of sub-pixels such that the data line includes the overlap portions opposite to the first electrodes of the column of sub-pixels.

7. The display panel according to claim 1, wherein the display array comprises:
   multiple columns of sub-pixels,
   wherein the signal lines and the display array are located in a display area of the display panel;
   in a direction perpendicular to the signal line, the display area includes a first sub-display area and a second sub-display area located between the first sub-display area and a non-display area;
   the first sub-display area and the second sub-display area all include at least one data line;
   the signal line includes the data line and a first connection line located in the first sub-display area;
   the first connection line is located between two adjacent data lines;
   the data line in the second sub-display area is connected to the first connection line through a second connection line;
   the first connection line is located on a side of the display array facing the substrate; and
   in a direction perpendicular to the display panel, the overlap portions include a first sub-overlap portion where the data line overlaps with the first electrode and/or a second sub-overlap portion where the first connection line overlaps with the first electrode.

8. The display panel according to claim 7, wherein:
   in the first sub-display area, a side of the sub-pixel facing the substrate includes one of the data lines and one of the first connection lines; and
   for a same sub-pixel, the first sub-overlap portion and the second sub-overlap portion are symmetrically arranged at both sides of a center of a same sub-pixel.

9. The display panel according to claim 8, wherein:
   for the same sub-pixel, the first sub-overlap portion and the second sub-overlap portion both include two through holes;
   for the first sub-overlap portion including the first conductive hole, at least one of the through holes is the first conductive hole configured for connecting the data line and the pixel circuit;
   for the second sub-overlap portion including the first conductive hole, at least one of the through holes is the first conductive hole configured for connecting the second connection line.

10. The display panel according to claim 7, wherein:
    both the first connection line and the data line are located in a first metal layer;
    the second connection line is located in a second metal layer; and
    the first metal layer is located between a metal layer where the first electrode is located and the second metal layer.

11. The display panel according to claim 10, wherein:
    the pixel circuit includes a transistor, and a source and a drain of the transistor are located in a third metal layer, wherein the third metal layer is located between the second metal layer and the substrate.

12. The display panel according to claim 10, wherein:
    a first organic layer is disposed between the first metal layer and the sub-pixel; and
    a second organic layer is disposed between the first metal layer and the second metal layer.

13. The display panel according to claim 10, wherein:
among the at least two overlap portions, an auxiliary hole is further disposed on a side of an overlap portion facing the substrate;
a second organic layer is disposed between the first metal layer and the second metal layer; and
a depth of the auxiliary hole is smaller than a thickness of the second organic layer.

14. The display panel according to claim 10, wherein:
among the at least two overlap portions, an auxiliary hole is further disposed on a side of an overlap portion facing the substrate;
a second organic layer is disposed between the first metal layer and the second metal layer; and
a depth of the auxiliary hole is not less than a thickness of the second organic layer.

15. The display panel according to claim 7, wherein:
the signal line further includes a third connection line located in the second sub-display area and extending in a same direction as the first connection line; and
in the second sub-display area, the overlap portions include a first sub-overlap portion where the data line overlaps with the first electrode, and a third sub-overlap portion where the third connection line overlaps with the first electrode.

16. The display panel according to claim 15, wherein:
the display panel includes a non-display area surrounding the display area;
the non-display area includes a power supply line surrounding at least a portion of the display area; and
the third signal line is connected to the power supply line.

17. The display panel according to claim 1, wherein:
the display array includes a first sub-pixel, a second sub-pixel and a third sub-pixel of different emission colors;
a pixel aperture of the first sub-pixel is greater than a pixel aperture of the second sub-pixel;
the pixel aperture of the second sub-pixel is greater than a pixel aperture of the third sub-pixel;
the overlap portions corresponding to first electrodes of at least a portion of the first sub-pixels and/or a portion of the second sub-pixels include the first conductive holes; and
orthographic projections of the overlap portions on the substrate are same.

18. The display panel according to claim 17, wherein:
the overlapping portions corresponding to the first sub-pixels all include the first conductive holes; and
orthographic projections of the overlap portions on the substrate are same.

19. The display panel according to claim 17, wherein:
for the overlap portions corresponding to the first sub-pixels in a same row, orthographic projections of adjacent two overlap portions on the substrate are different, and orthographic projections of next adjacent two overlap portions on the substrate are same; or
for the overlapping portions corresponding to the second sub-pixels in a same row, orthographic projections of adjacent two overlap portions on the substrate are different, and orthographic projections of next adjacent two overlap portions on the substrate are same.

20. An electronic device, comprising:
a display panel, including:
an array substrate, including a substrate, a pixel circuit disposed on the substrate, and a plurality of signal lines distributed in parallel and disposed on a side of the pixel circuit away from the substrate, wherein the plurality of signal lines are connected to wirings below the plurality of signal lines through first conductive holes;
a display array, including a plurality of sub-pixels and located on a side of the plurality of signal lines away from the substrate,
wherein:
in a direction perpendicular to the substrate, the signal lines include overlap portions overlapping first electrodes of the plurality of sub-pixels;
at least two overlap portions correspond to sub-pixels of a same emission color and include first conductive holes; and
orthographic projections of the at least two overlap portions on the substrate are same.

* * * * *